(12) United States Patent
Egami et al.

(10) Patent No.: US 9,449,997 B2
(45) Date of Patent: Sep. 20, 2016

(54) ELECTRO-OPTICAL DEVICE, ELECTRONIC APPARATUS, AND METHOD FOR MANUFACTURING ELECTRO-OPTICAL DEVICE

(71) Applicant: Seiko Epson Corporation, Tokyo (JP)

(72) Inventors: Takafumi Egami, Eniwa (JP); Shin Oyamada, Eniwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 14/919,457

(22) Filed: Oct. 21, 2015

(65) Prior Publication Data

US 2016/0133655 A1 May 12, 2016

(30) Foreign Application Priority Data

Nov. 10, 2014 (JP) ................. 2014-227806

(51) Int. Cl.
*H01L 29/12* (2006.01)
*H01L 27/12* (2006.01)

(52) U.S. Cl.
CPC ....... *H01L 27/1255* (2013.01); *H01L 27/1259* (2013.01)

(58) Field of Classification Search
CPC .............. H01L 27/1255; H01L 27/1259
USPC ............................................. 257/71
See application file for complete search history.

(56) References Cited

U.S. PATENT DOCUMENTS

| 7,791,088 B2 | 9/2010 | Ishii |
| 8,148,730 B2 | 4/2012 | Hosoya et al. |
| 2013/0021542 A1 | 1/2013 | Ito et al. |

FOREIGN PATENT DOCUMENTS

| JP | 11-160736 A | 6/1999 |
| JP | 2007-192974 A | 8/2007 |
| JP | 2009-124121 A | 6/2009 |
| JP | 2013-025069 A | 2/2013 |

OTHER PUBLICATIONS

US 6,104,051, 08/2000, Suzawa (withdrawn)

*Primary Examiner* — Douglas Menz
(74) *Attorney, Agent, or Firm* — ALG Intellectual Property, LLC

(57) ABSTRACT

An electro-optical device includes an element substrate main body, a first capacitance electrode that is arranged above the element substrate main body, and has a first metal film and a second metal film which is stacked onto the first metal film, a first protective insulating film that is arranged so as to cover a side wall of the first metal film, and expose at least a portion of a side wall of the second metal film, a dielectric film that is arranged throughout the side wall of the second metal film which is exposed from the first protective insulating film, and over the second metal film, and a second capacitance electrode that is arranged throughout the dielectric film on the second metal film, and over the dielectric film which is arranged in the side wall of the second metal film exposed from the first protective insulating film.

8 Claims, 12 Drawing Sheets

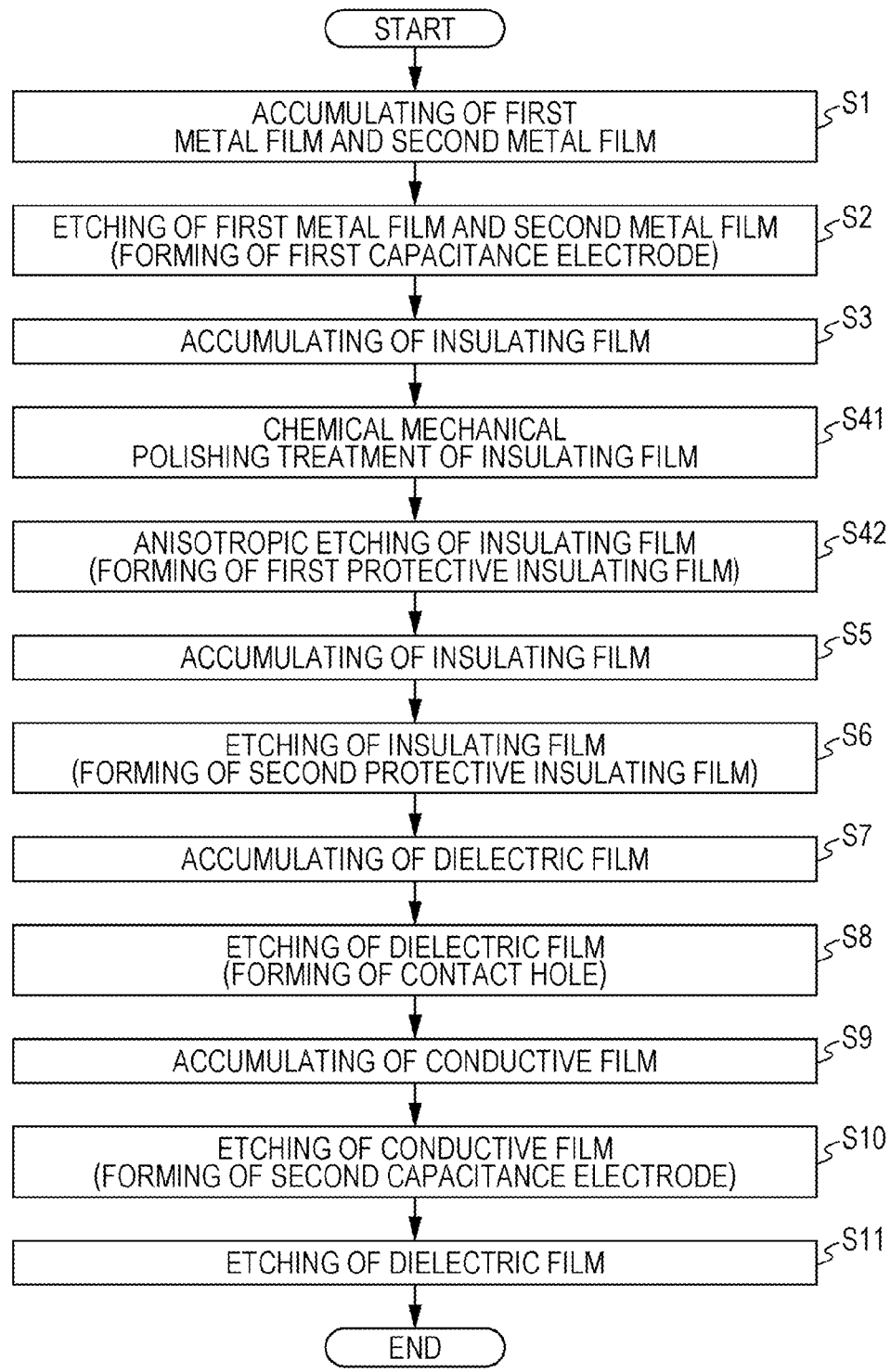

ELECTRO-OPTICAL DEVICE, ELECTRONIC APPARATUS, AND METHOD FOR MANUFACTURING ELECTRO-OPTICAL DEVICE

BACKGROUND

1. Technical Field

The present invention relates to an electro-optical device, an electronic apparatus on which the electro-optical device is mounted, and a method for manufacturing the electro-optical device.

2. Related Art

As an electro-optical device, for example, an active drive type liquid crystal device which is used as an optical modulation measure (light bulb) of a liquid crystal projector, is used. In a pixel of the liquid crystal device, a storage capacitor is formed for retaining an image signal which is written into a pixel electrode, and potential retention properties of the image signal in the pixel electrode is enhanced.

For example, an electro-optical device (liquid crystal device) which is described in JP-A-2013-25069, has a storage capacitor where a first electrode, a dielectric layer, and a second electrode are stacked in sequence. The first electrode is formed over a plurality of pixels, and a common potential is supplied thereto. That is, the first electrode is a capacitance line to which the common potential is supplied. The first electrode has a two-layered structure where aluminum and a titanium nitride are stacked in sequence, and lowering of resistance is achieved by the aluminum which is positioned on the lower layer side, and a change of the potential which is supplied to the first electrode is suppressed. The second electrode is formed into an island shape per pixel, and the potential which is supplied to the pixel electrode is supplied thereto.

Furthermore, between the first electrode and the dielectric layer, an insulating film (etching stopper) which protects the first electrode is formed so that the first electrode is not affected at the time of etching the dielectric layer and the second electrode. In the insulating film, an opening which exposes a surface (portion where the titanium nitride is positioned) of the first electrode is formed. The dielectric layer and the second electrode are stacked in sequence on the surface of the first electrode which is exposed by the opening of the insulating film, and thereby, the above-described storage capacitor is formed. Hence, a capacitance value of the storage capacitor depends on an opening area (exposed area of the surface of the first electrode) of the insulating film.

The opening of the insulating film is formed by performing a dry etching treatment of the insulating film. If the insulating film is dry-etched, a reaction product (deposition material) is deposited on the etched face (surface of the first electrode which is exposed by the opening). Since the reaction product increases the resistance of the surface of the first electrode, there is a need of removing the reaction product by being immersed in a drug solution containing hydrofluoric acid after the dry etching of the insulating film.

In the liquid crystal device of the light bulb purpose, there is the need of making capacitance enlargement of the storage capacitor in order to obtain an image of high quality while achieving refinement (densification) of the pixel. Furthermore, if the pixel is refined (densified), since the capacitance line (first electrode) of the storage capacitor becomes thin, there is the need of forming the capacitance line (first electrode) by aluminum of a low resistance material, and of suppressing the increase of the resistance (time constant) of the capacitance line (first electrode). However, in the electro-optical device which is described in JP-A-2013-25069, when the capacitance line (first electrode) is formed by the aluminum of the low resistance material, there is a problem that the capacitance enlargement of the storage capacitor is unlikely to be achieved.

Specifically, in the aluminum of the low resistance material, a tolerance with respect to the drug solution containing hydrofluoric acid is weak. In order to make the capacitance enlargement of the storage capacitor, if the opening area of the insulating film is increased, a portion where the aluminum of the first electrode is positioned may be exposed. If the portion where the aluminum of the first electrode is positioned is exposed, a failure that the aluminum is affected (corroded) is generated, by the treatment (immersing) of the drug solution containing hydrofluoric acid for removing the reaction product. Hence, there is the problem that the opening area of the insulating film becomes large, and the capacitance enlargement of the storage capacitor is unlikely to be achieved.

SUMMARY

The invention can be realized in the following forms or application examples.

Application Example 1

According to this application example, there is provided an electro-optical device including: a substrate; a lower capacitance electrode that is arranged above the substrate, and has a first metal film and a second metal film which is stacked onto the first metal film; a first protective insulating film that is arranged so as to cover a side wall of the first metal film, and expose at least a portion of a side wall of the second metal film; a dielectric film that is arranged throughout the side wall of the second metal film which is exposed from the first protective insulating film, and over the second metal film; and an upper capacitance electrode that is arranged throughout the dielectric film on the second metal film, and over the dielectric film which is arranged in the side wall of the second metal film exposed from the first protective insulating film.

A portion (at least the portion of the side wall of the second metal film) of the side wall of the lower capacitance electrode, and a surface of the lower capacitance electrode are not covered by the first protective insulating film, and are exposed. Accordingly, a storage capacitor is formed between the portion (at least the portion of the side wall of the second metal film) of the side wall of the lower capacitance electrode and the dielectric film and the upper capacitance electrode, and between the surface of the lower capacitance electrode and the dielectric film and the upper capacitance electrode. Consequently, it is possible to achieve capacitance enlargement of the storage capacitor, in comparison with a case where the storage capacitor is formed only between the surface of the lower capacitance electrode and the dielectric film and the upper capacitance electrode.

Furthermore, the first metal film configuring the lower capacitance electrode may not be affected (corroded) by a drug solution or the like, since being covered (protected) by the first protective insulating film and the second metal film. Hence, it is possible to configure the first metal film by a low resistance material such as aluminum of which a tolerance with respect to the drug solution is weak. Accordingly, the first metal film can be configured by the low resistance material such as aluminum, and it is possible to lower the resistance of the lower capacitance electrode.

Application Example 2

In the electro-optical device according to the application example, a direction along the substrate may be a first direction, and an angle which is made by the first direction and the side wall of the second metal film, may be greater than an angle which is made by the first direction and the side wall of the first metal film.

If the angle which is made by the first direction and the side wall of the first metal film is smaller than the angle which is made by the first direction and the side wall of the second metal film, that is, if the side wall of the first metal film is formed into a gentle slope in comparison with a slope of the side wall of the second metal film, since the first protective insulating film is likely to cover the side wall of the first metal film, the first protective insulating film which covers the side wall of the first metal film is likely to be formed.

If the angle which is made by the first direction and the side wall of the second metal film is greater than the angle which is made by the first direction and the side wall of the first metal film, that is, if the side wall of the second metal film is formed into the steep slope in comparison with the slope of the side wall of the first metal film, since the first protective insulating film is unlikely to cover the side wall of the second metal film, the first protective insulating film which exposes at least the portion of the side wall of the second metal film is likely to be formed.

Application Example 3

In the electro-optical device according to the application example, a film thickness of the second metal film may be the same as a film thickness of the first metal film, or greater than the film thickness of the first metal film.

If the film thickness of the second metal film is the same as the film thickness of the first metal film, or is greater than the film thickness of the first metal film, it is possible to make a capacitance value of the storage capacitor which is formed between the portion (at least the portion of the side wall of the second metal film) of the side wall of the lower capacitance electrode and the dielectric film and the upper capacitance electrode be large, in comparison with the case where the film thickness of the second metal film is smaller than the film thickness of the first metal film.

Application Example 4

The electro-optical device according to the application example may further include a second protective insulating film that is positioned between the lower capacitance electrode and the dielectric film, and covers the lower capacitance electrode of a portion which does not overlap with the upper capacitance electrode in a planar view.

Since being covered (protected) by the second protective insulating film, it is suppressed that the lower capacitance electrode of the portion which does not overlap with the upper capacitance electrode in the planar view may be affected by the etching of forming the upper capacitance electrode.

Application Example 5

According to this application example, there is provided an electronic apparatus including: the electro-optical device according to the above-described application example.

Since the capacitance enlargement of the storage capacitor is achieved in the electro-optical device which is described in the above application examples, potential retention properties of a pixel is enhanced, and it is possible to provide a display of high quality. Accordingly, the electronic apparatus including the electro-optical device which is described in the above application examples, can provide the high-quality display.

For example, by applying the electro-optical device which is described in the above application examples to the electronic apparatus such as a projection type display device, a projection type head-up display (HUD), a direct viewing type head mounted display (HMD), an electronic book, a personal computer, a digital still camera, a liquid crystal television, a view finder type or monitor direct viewing type video recorder, a car navigation system, an information terminal device such as a POS, or an electronic organizer, it is possible to provide the high-quality display.

Application Example 6

According to this application example, there is provided a method for manufacturing an electro-optical device including: depositing a first metal film and a second metal film in sequence, above a substrate; forming a lower capacitance electrode by etching the second metal film and the first metal film in sequence; depositing an insulating film which covers the lower capacitance electrode; forming a first protective insulating film which covers a side wall of the first metal film and exposes at least a portion of a side wall of the second metal film, by performing an anisotropic etching of the insulating film in a normal direction of the substrate; depositing a dielectric film throughout the side wall of the second metal film which is exposed from the first protective insulating film, and over the second metal film; depositing a conductive film; and forming an upper capacitance electrode throughout the dielectric film on the second metal film, and over the dielectric film which is arranged in the side wall of the second metal film exposed from the first protective insulating film, by etching the conductive film.

Since a dimension (thickness) of the insulating film of the portion which covers the side wall of the lower capacitance electrode in the normal direction of the substrate is greater than a dimension (thickness) of the insulating film of the portion which covers the surface of the lower capacitance electrode in the normal direction of the substrate, if the anisotropic etching of the insulating film in the normal direction of the substrate is performed, it is possible to remove the insulating film of the portion which covers the surface of the lower capacitance electrode, and it is possible to leave the insulating film of the portion which covers the side wall of the lower capacitance electrode. By performing the anisotropic etching of the insulating film in the normal direction of the substrate so that the insulating film is left in the portion of the side wall of the lower capacitance electrode, it is possible to form the first protective insulating film which covers the side wall of the first metal film, and exposes at least the portion of the side wall of the second metal film.

Furthermore, through the depositing of the dielectric film and the forming of the upper capacitance electrode, it is possible to form the storage capacitor on both sides between at least the portion (portion of the side wall of the lower capacitance electrode) of the side wall of the second metal film and the dielectric film and the upper capacitance electrode, and between the surface of the lower capacitance electrode and the dielectric film and the upper capacitance electrode.

Application Example 7

In the method for manufacturing an electro-optical device according to the application example, the forming of the first protective insulating film may include performing a chemical mechanical polishing treatment of the insulating film, and performing the anisotropic etching of the insulating film in the normal direction, so as to cover the side wall of the first metal film, and expose at least a portion of the side wall of the second metal film.

Since the dimension (thickness) of the insulating film of the portion which covers the surface of the lower capacitance electrode in the normal direction of the substrate becomes small due to the chemical mechanical polishing treatment, the etching time of performing the anisotropic etching of the insulating film in the normal direction of the substrate becomes short, so as to remove the insulating film of the portion which covers the surface of the lower capacitance electrode, and leave the insulating film in the portion of the side wall of the lower capacitance electrode, and it is possible to improve productivity of the anisotropic etching.

Furthermore, if the etching time of the anisotropic etching is shortened and the dimension of the etched insulating film is reduced, a variation in the etching dimension of the insulating film becomes small, and it is possible to improve uniformity of the dimension (film thickness) of the left insulating film (first protective insulating film).

Application Example 8

In the method for manufacturing an electro-optical device according to the application example, in the forming of the lower capacitance electrode, when a direction along the substrate is a first direction, the second metal film and the first metal film may be etched in sequence such that an angle which is made by the first direction and the side wall of the second metal film is greater than an angle which is made by the first direction and the side wall of the first metal film.

If the second metal film and the first metal film are etched in sequence so that the angle which is made by the first direction and the side wall of the second metal film is greater than the angle which is made by the first direction and the side wall of the first metal film, since the side wall of the second metal film is formed into the steep slope in comparison with the slope of the side wall of the first metal film, and the first protective insulating film is unlikely to cover the side wall of the second metal film, it is easy to form the first protective insulating film which exposes at least the portion of the side wall of the second metal film.

Application Example 9

In the method for manufacturing an electro-optical device according to the application example, in the depositing of the first metal film and the second metal film in sequence, the first metal film and the second metal film may be deposited in sequence such that a film thickness of the second metal film is the same as a film thickness of the first metal film, or is greater than the film thickness of the first metal film.

If the second metal film is formed so that the film thickness thereof is the same as the film thickness of the first metal film, or is greater than the film thickness of the first metal film, it is possible to make the capacitance value of the storage capacitor which is formed between the side wall of the second metal film and the dielectric film and the upper capacitance electrode be large, in comparison with the case where the film thickness of the second metal film is smaller than the film thickness of the first metal film.

Application Example 10

The method for manufacturing an electro-optical device according to the application example may further include forming a second protective insulating film that covers the lower capacitance electrode of a portion which does not overlap with the upper capacitance electrode in a planar view, between the forming of the first protective insulating film and the depositing of the dielectric film.

Since the lower capacitance electrode of the portion which does not overlap with the upper capacitance electrode in the planar view is covered (protected) by the second protective insulating film, it is possible to suppress that the lower capacitance electrode of the portion which does not overlap with the upper capacitance electrode in the planar view may be affected by the etching of forming the upper capacitance electrode.

Application Example 11

The method for manufacturing an electro-optical device according to the application example may further include removing the dielectric film which is extended from the upper capacitance electrode, after the forming of the upper capacitance electrode.

The portion which is extended from the upper capacitance electrode, becomes a display region where the light is modulated.

In order to make the capacitance enlargement of the storage capacitor, a dielectric constant (refractive index) of the dielectric film is preferably large. That is, it is preferable that the dielectric film is configured by a material of high refractive index. If the dielectric film of the high refractive index is positioned in the portion (display region) which is extended from the upper capacitance electrode, reflection of the light is generated between other insulating films of which the refractive indexes are different from each other, and usage efficiency of the light is lowered in the display region. Accordingly, it is preferable that the dielectric film which is extended from the upper capacitance electrode is removed, by arranging the removing of the dielectric film which is extended from the upper capacitance electrode, after the forming of the upper capacitance electrode.

BRIEF DESCRIPTION OF THE DRAWINGS

The invention will be described with reference to the accompanying drawings, wherein like numbers reference like elements.

FIG. 11 is a process flow illustrating a method for manufacturing the liquid crystal device according to Embodiment 2.

DESCRIPTION OF EXEMPLARY EMBODIMENTS

Figure 1:
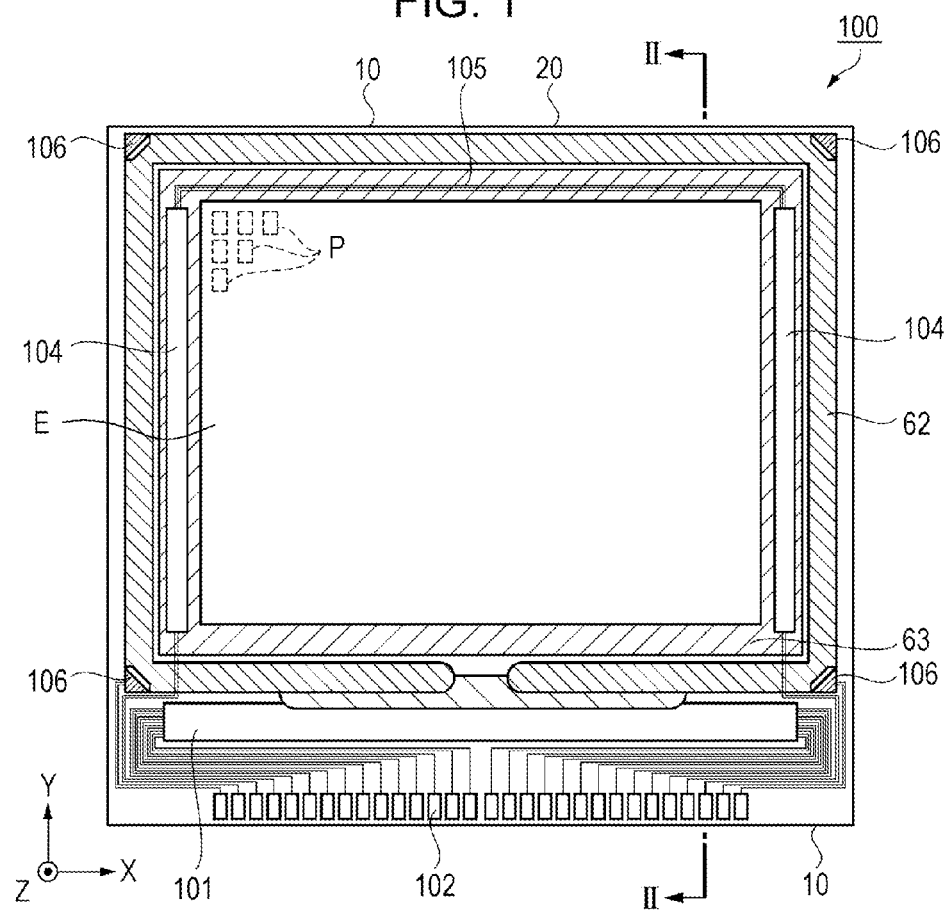
FIG. 1 is a schematic plan view illustrating a configuration of a liquid crystal device according to Embodiment 1.

Hereinafter, embodiments of the invention will be described with reference to drawings. Such the embodiment illustrates one aspect of the specification, and does not limit the invention, and can be optionally modified within the scope of technical ideas of the specification. Moreover, in each of the following drawings, scales of each layer and each portion are made to be different from actual values, in order to make each layer and each portion having sizes of degrees which can be identified on the drawing.

Embodiment 1

Outline of Liquid Crystal Device

A liquid crystal device 100 according to Embodiment 1, is an example of an electro-optical device, and is a transmission type liquid crystal device including a thin film transistor (referred to as TFT hereinafter) 30. For example, the liquid crystal device 100 can be suitably used as a light modulation element of a liquid crystal projector described later.

Figure 2:
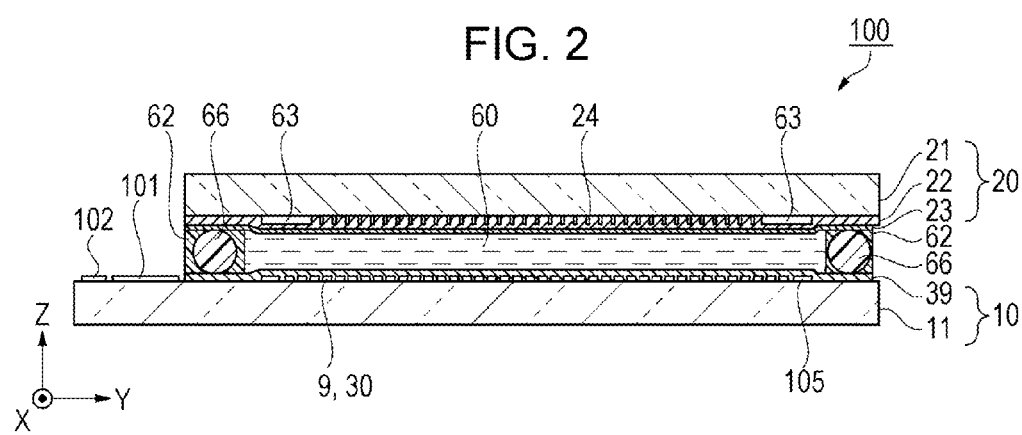
FIG. 2 is a schematic sectional view of the liquid crystal device taken along II-II line of FIG. 1.
Figure 3:
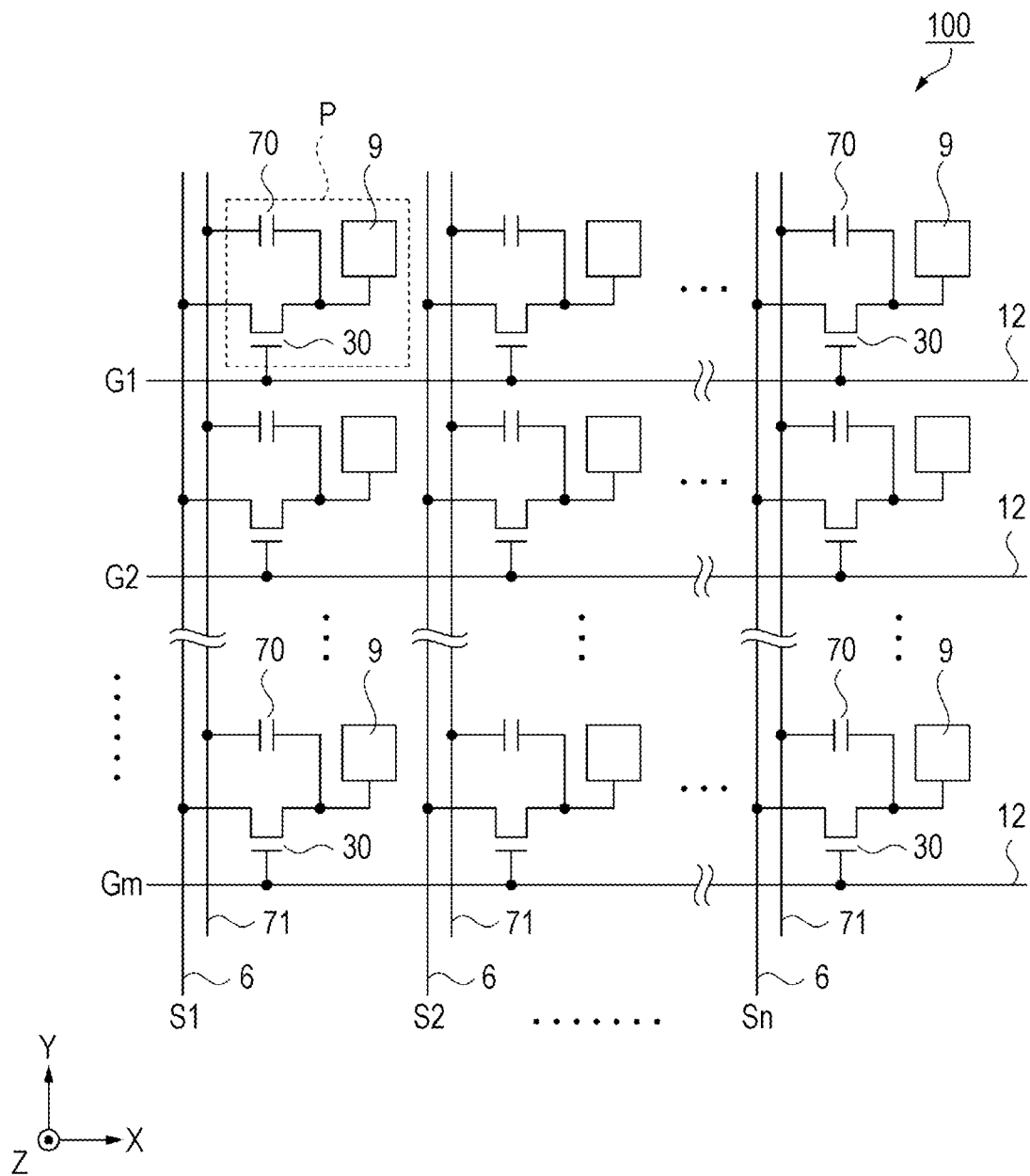
FIG. 3 is an equivalent circuit diagram illustrating an electrical configuration of the liquid crystal device according to the Embodiment 1.

FIG. 1 is a schematic plan view illustrating a configuration of the liquid crystal device 100 according to Embodiment 1. FIG. 2 is a schematic sectional view of the liquid crystal device 100 taken along II-II line of FIG. 1. FIG. 3 is an equivalent circuit diagram illustrating an electrical configuration of the liquid crystal device 100.

First, an outline of the liquid crystal device 100 according to Embodiment 1, will be described with reference to FIG. 1 to FIG. 3.

As illustrated in FIG. 1 and FIG. 2, the liquid crystal device 100 includes an element substrate 10 and a counter substrate 20 which are positioned counter to each other, and a liquid crystal layer 60 which is pinched by a pair of substrates described above.

The element substrate 10 is greater than the counter substrate 20. The element substrate 10 and the counter substrate 20 are bonded through a sealing material 62 which is positioned into a frame shape, and the liquid crystal having positive or negative dielectric anisotropy is sealed into a gap therebetween, and thereby, the liquid crystal layer 60 is configured. For example, an adhesive such as a heat-curable or ultraviolet-curable epoxy resin, is adopted as a sealing material 62. A spacer 66 for retaining a space between the pair of substrates to be uniform, is mixed into the sealing material 62.

On an inside of the sealing material 62 which is positioned into the frame shape, a same frame-shaped light-shielding film 63 is arranged. For example, the light-shielding film 63 is made up of a metal or a metal oxide having light-shielding properties, and the inside of the light-shielding film 63 becomes a display region E. In the display region E, a plurality of pixels P are positioned into a matrix shape.

A data line drive circuit 101 is arranged between one side portion where a plurality of external connection terminals 102 of the element substrate 10 are arrayed and the sealing material 62 along the one side portion. A scan line drive circuit 104 is arranged on the inside of the sealing material 62 along other two side portions which are perpendicular to the one side portion and are positioned counter to each other. On the inside of the sealing material 62 of another one side portion which is positioned counter to the one side portion, a plurality of wires 105 linking two scan line drive circuits 104 are arranged. The wire which is linked to the data line drive circuit 101 and the scan line drive circuit 104, is connected to the plurality of external connection terminals 102 which are arrayed along the one side portion.

Hereinafter, a direction along the one side portion will be described as a X direction, and a direction along other two side portions which are perpendicular to the one side portion and are positioned counter to each other will be described as a Y direction, and a direction heading toward the counter substrate 20 from the element substrate 10 will be described as a Z direction. Moreover, a view which is seen from the Z direction is referred to as a planar view.

Furthermore, the X direction is an example of a "first direction". The Z direction is an example of a "normal direction of the substrate".

As illustrated in FIG. 2, the element substrate 10 includes an element substrate main body 11, a TFT 30 and a pixel electrode 9 which are formed on a face of the liquid crystal layer 60 side of the element substrate main body 11, and an alignment film 39 covering the pixel electrode 9. For example, the element substrate main body 11 is configured of a transparent material such as quartz or glass. Moreover, the TFT 30 and the pixel electrode 9 are components of the pixel P, and the pixels P are arrayed into the matrix shape in the X direction and the Y direction.

Furthermore, the element substrate main body 11 is an example of the "substrate".

The counter substrate 20 includes a counter substrate main body 21, light-shielding films 24 and 63 which are stacked in sequence on a face of the liquid crystal layer 60 side of the counter substrate main body 21, a counter electrode 22, and an alignment film 23.

For example, the counter substrate main body 21 is configured of the transparent material such as quartz or glass.

For example, the light-shielding films 24 and 63 are made up of the metal or the metal oxide having the light-shielding properties. The light-shielding film 63 is arranged into the frame shape in the position which planarly overlaps with the scan line drive circuit 104 (see FIG. 1). The light-shielding film 24 is arranged in the position which planarly overlaps with the TFT 30. Hereby, the light which is incident to the element substrate 10 from the counter substrate 20 is shielded, and the light-shielding films 24 and 63 serve a function of preventing a malfunction due to the light of the scan line drive circuit 104 and the TFT 30. Moreover, the light is shielded so that the unnecessary stray light is not incident to the display region E, and thereby, a high contrast is secured in a display of the display region E.

For example, the counter electrode 22 is made up of a transparent conductive film such as an indium tin oxide (ITO), and is formed throughout the display region E. The counter electrode 22 is electrically connected to the wire of the element substrate 10 side by upper and lower conduction portions 106 which are arranged at four corners of the counter substrate 20 (see FIG. 1).

The alignment film 39 covering the pixel electrode 9 and the alignment film 23 covering the counter electrode 22, are set based on an optical design of the liquid crystal device 100, and are configured of an oblique deposition film (inorganic alignment film) of an inorganic material such as a silicon oxide, in Embodiment 1. Moreover, the alignment films 39 and 23 may use an organic alignment film such as polyimide.

As illustrated in FIG. 3, the liquid crystal device 100 includes a plurality of scan lines 12 and a plurality of data lines 6 as signal lines which are insulated to each other and are perpendicular to each other at least in the display region E, and a first capacitance electrode 71 which is extended in the same direction as the data line 6. Furthermore, the arrangement of the first capacitance electrode 71 is not limited thereto, and the first capacitance electrode 71 may be positioned so as to be extended in the same direction as the scan line 12.

The pixel electrode 9, the TFT 30, and a storage capacitor 70 are arranged in the region which is divided by the scan line 12 and the data line 6, and configure a pixel circuit of the pixel P.

The scan line 12 is electrically connected to a gate (gate electrode 37, see FIG. 5) of the TFT 30, and the data line 6 is electrically connected to a source (source region 32 of a semiconductor layer 31, see FIG. 5) of the TFT 30. The pixel electrode 9 is electrically connected to a drain (drain electrode 38, see FIG. 5) of the TFT 30.

The data line 6 is connected to the data line drive circuit 101 (FIG. 1), and image signals S1, S2, . . . , Sn which are supplied from the data line drive circuit 101 are supplied to each pixel P. The scan line 12 is connected to the scan line drive circuit 104 (FIG. 1), and scan signals G1, G2, . . . , Gm which are supplied from the scan line drive circuit 104 are supplied to each pixel P. The image signals S1 to Sn which are supplied from the data line drive circuit 101 to the data line 6, may be line-sequentially supplied in the sequence, and may be supplied per group with respect to the plurality of data lines 6 which are adjacent to each other.

Furthermore, a fixed potential (for example, common potential Vcom) is supplied to the first capacitance electrode 71. That is, the first capacitance electrode 71 is a capacitance line to which the fixed potential is supplied.

The liquid crystal device 100 is configured such that the image signals S1 to Sn which are supplied from the data line 6 are written into the pixel electrode 9 at a predetermined timing, by making the TFT 30 which is a switching element be in an ON state only for a certain period by inputs of the scan signals G1 to Gm. Voltages of the image signals S1 to Sn which are written into the pixel electrode 9, are changed in a range of −5 V to +5 V with respect to the counter electrode 22. Therefore, the image signals S1 to Sn of predetermined levels which are written into the liquid crystal layer 60 through the pixel electrode 9, are retained for a certain period between the pixel electrode 9 and the counter electrode 22 which is positioned counter to the pixel electrode 9 through the liquid crystal layer 60 and functions as a common electrode.

In order to prevent the retained image signals S1 to Sn from leaking (deteriorating), the storage capacitor 70 is connected in parallel to a liquid crystal capacitance which is formed between the pixel electrode 9 and the counter electrode 22. Although details thereof will be described later, the storage capacitor 70 is formed between a second capacitance electrode 77 (see FIG. 5) which is electrically connected to the drain electrode 38 of the TFT 30, and the first capacitance electrode 71.

Such the liquid crystal device 100 is the transmission type, and adopts the optical design of a normally white mode of making a bright display in which the transmittance of the pixel P at the time of applying no voltage is greater than the transmittance of the pixel P at the time of applying the voltage, and a normally black mode of making a dark display in which the transmittance of the pixel P at the time of applying no voltage is smaller than the transmittance of the pixel P at the time of applying the voltage. Depending on the optical design, polarization elements (of which the illustration is omitted) are used by being positioned respectively on an incidence side and an emission side of the light.

Configuration of Pixel

Figure 4:
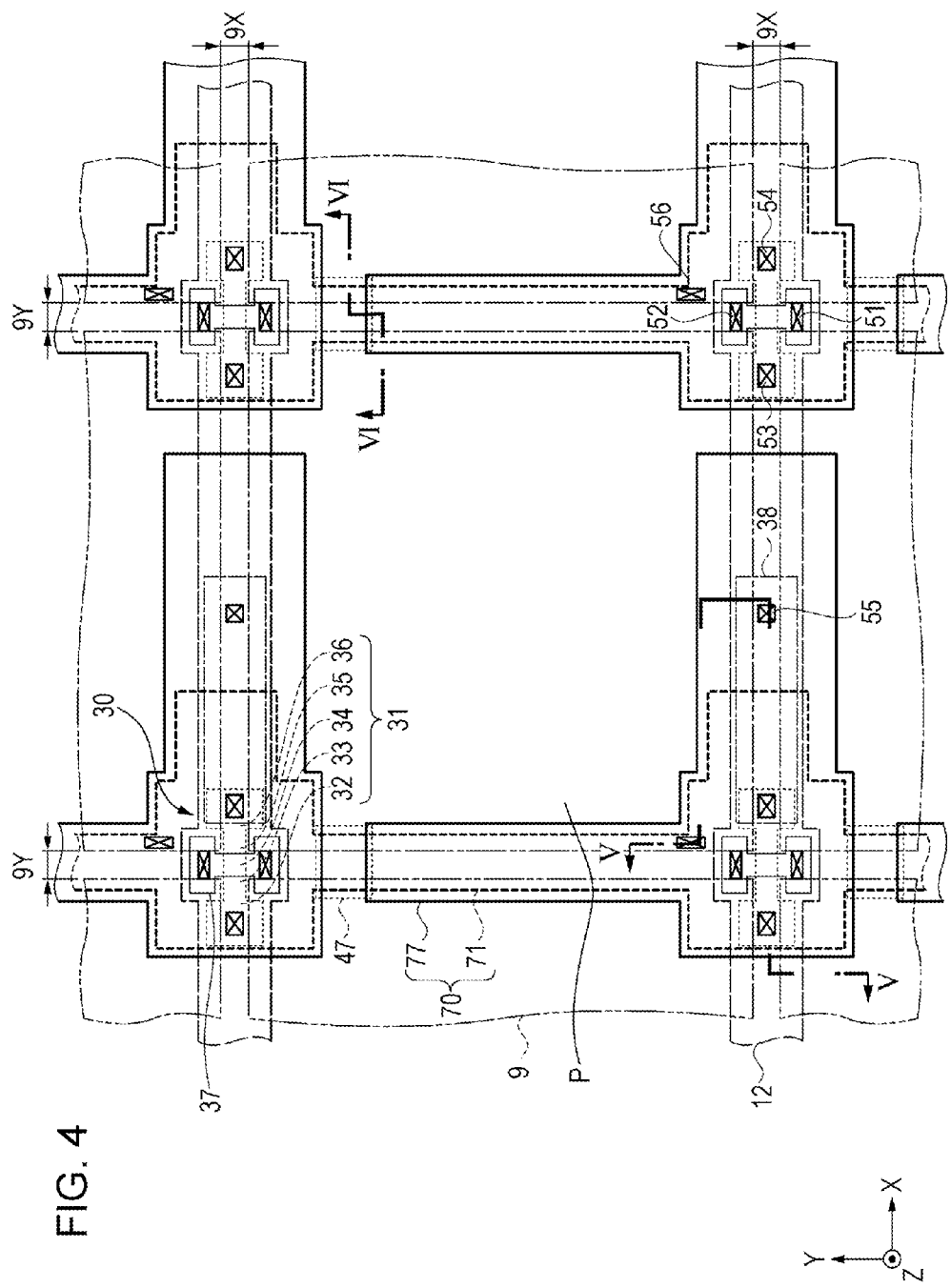
FIG. 4 is a schematic plan view of a plurality of pixels which are adjacent to each other.
Figure 5:
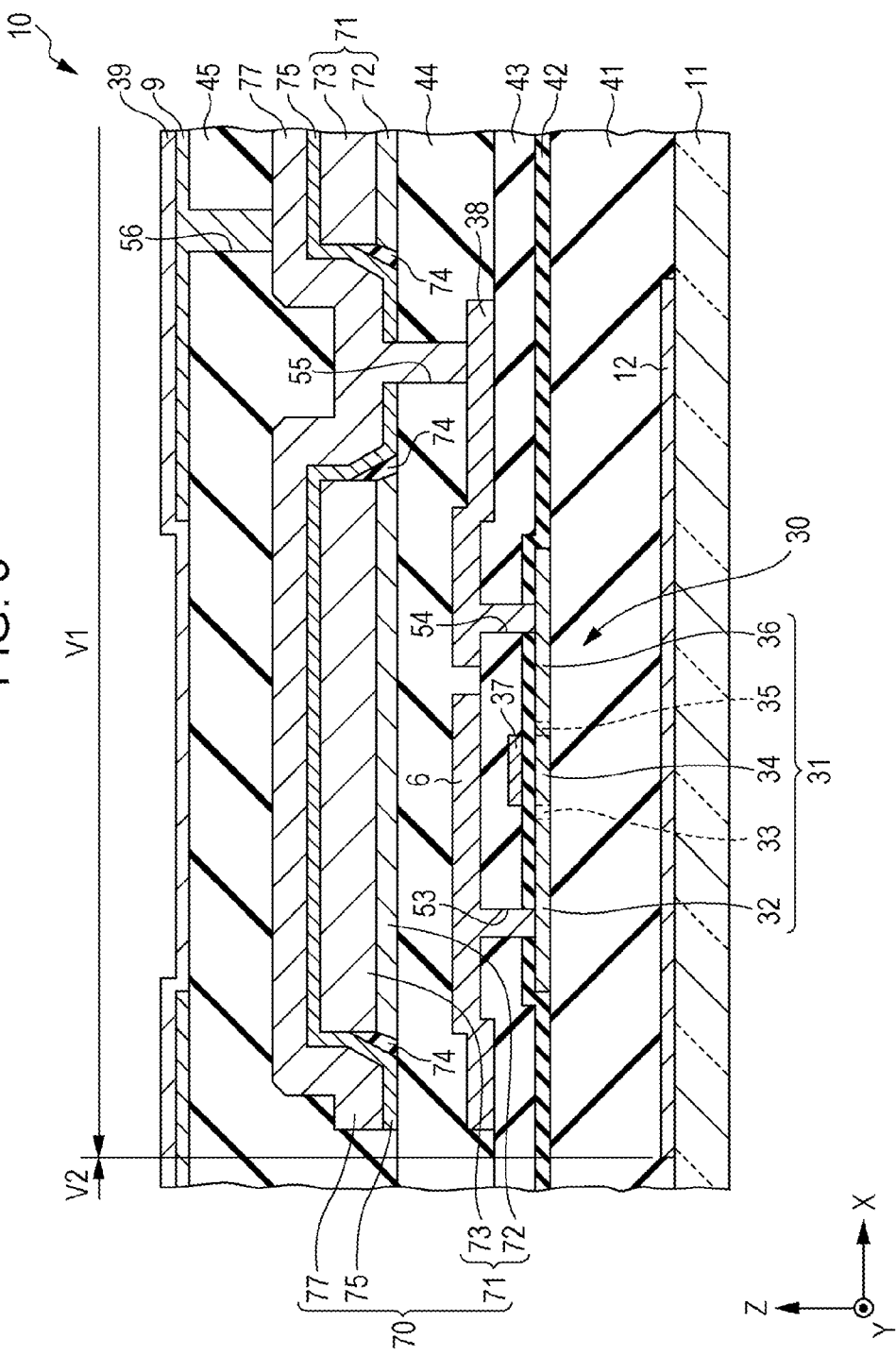
FIG. 5 is a schematic sectional view of an element substrate taken along V-V line of FIG. 4.
Figure 6:
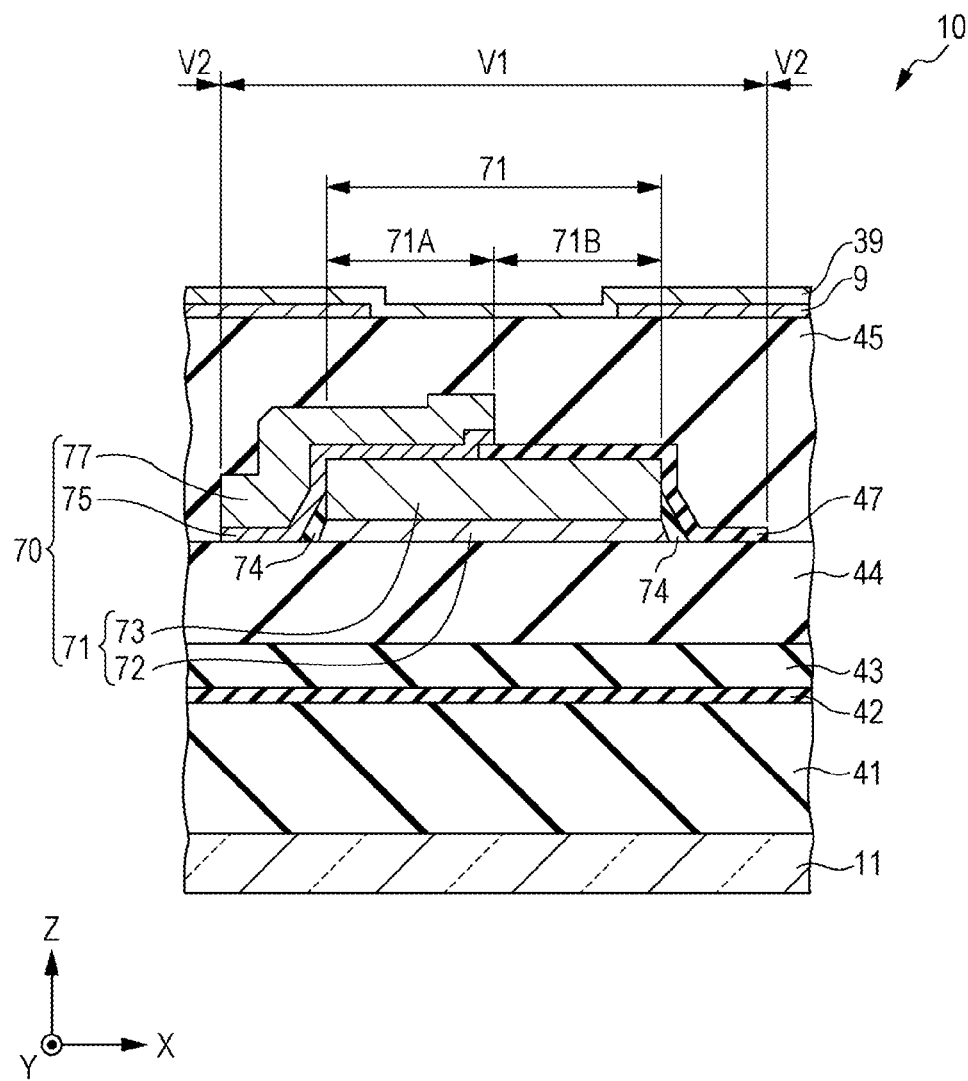
FIG. 6 is a schematic sectional view of the element substrate taken along VI-VI line of FIG. 4.

FIG. 4 is a schematic plan view of the plurality of pixels which are adjacent to each other. FIG. 5 is a schematic sectional view of the element substrate taken along V-V line of FIG. 4. FIG. 6 is a schematic sectional view of the element substrate taken along VI-VI line of FIG. 4. That is, FIG. 6 is a schematic sectional view of a boundary portion of the second capacitance electrode 77 which is adjacent to the second capacitance electrode 77.

In FIG. 4, the scan line 12 is illustrated by a thin and long dashed line, and the semiconductor layer 31 and a second protective insulating film 47 are illustrated by thin and short dotted lines, and the gate electrode 37 is illustrated by a thin solid line, and the drain electrode 38 is illustrated by a one-dot chain line, and the first capacitance electrode 71 is illustrated by a thick dashed line, and the second capacitance electrode 77 is illustrated by a thick solid line, and the pixel electrode 9 is illustrated by a two-dot chain line. Moreover, a portion which is pinched between the pixel electrodes 9 along the X direction is referred to as a region 9X, and a portion which is pinched between the pixel electrodes 9 along the Y direction is referred to as a region 9Y.

Hereinafter, a configuration of the pixel P will be described with reference to FIG. 4 to FIG. 6.

As illustrated in FIG. 4, in the element substrate 10, the rectangular-shaped pixel electrodes 9 are respectively formed in the plurality of pixels P.

The scan line 12 is formed so as to cover the region 9X (region where the pixel electrode 9 is not formed) along the X direction. That is, the scan line 12 overlaps with an end portion of the pixel electrode 9 along the X direction in the planar view, and is extended in the X direction.

The first capacitance electrode 71 is arranged so as to cover the region 9Y (region where the pixel electrode 9 is not formed) along the Y direction. The first capacitance electrode 71 is formed throughout the plurality of pixels P (display region E). The first capacitance electrode 71 includes the portion which is prolonged along the Y direction, and the portion which is extended in the X direction. The portion of the first capacitance electrode 71 which is prolonged along the Y direction overlaps with the end portion of the pixel electrode 9 along the Y direction in the planar view, and is extended in the Y direction.

Furthermore, the first capacitance electrode 71 is an example of a "lower capacitance electrode".

Although the illustration thereof is omitted, the data line 6 (see FIG. 5) is formed, so as to overlap with the portion of the first capacitance electrode 71 which is prolonged along the Y direction in the planar view. That is, the data line 6 which overlaps with the end portion of the pixel electrode 9 along the Y direction in the planar view and is extended in the Y direction, is formed.

In the region where the scan line 12 intersects with the data line 6 (portion of the first capacitance electrode 71 which is prolonged along the Y direction), the TFT 30 is formed. The TFT 30 includes the semiconductor layer 31 which is prolonged in the X direction, and the gate electrode 37 which is prolonged in the Y direction. The rectangular-shaped drain electrode 38 which is prolonged in the X direction is formed, so as to cover the end portion of the semiconductor layer 31 on an X(+) direction side.

In the semiconductor layer 31, the portion which overlaps with the gate electrode 37 in the planar view becomes a channel region 34. A drain region 36 is positioned on the drain electrode 38 side, and a source region 32 is positioned on the side which is opposite to the drain electrode 38, by pinching the channel region 34 therebetween. Furthermore, a source side bonding region 33 is positioned between the source region 32 and the channel region 34, and a drain side bonding region 35 is positioned between the drain region 36 and the channel region 34. That is, the TFT 30 includes the semiconductor layer 31 having a lightly doped drain (LDD) structure.

The second capacitance electrode 77 is formed, so as to cover the portion of the first capacitance electrode 71 which is prolonged along the Y direction and the portion of the first capacitance electrode 71 which is extended in the X direction. The second capacitance electrode 77 becomes almost an L-shape, and is formed into an island shape in each of the pixels P. The second capacitance electrode 77 is formed by being extended from the end portion of the first capacitance electrode 71 in the planar view, so as to cover a surface and a side wall of the first capacitance electrode 71. The storage capacitor 70 is formed in the portion where the first capacitance electrode 71 overlaps with the second capacitance electrode 77 in the planar view.

Furthermore, the second capacitance electrode 77 is an example of an "upper capacitance electrode".

As described above, the first capacitance electrode 71 is formed throughout the plurality of pixels P, and the second capacitance electrode 77 is formed into the island shape per pixel P. Hence, the first capacitance electrode 71 which does not overlap with the second capacitance electrode 77 in the planar view, is positioned between the second capacitance electrode 77 which is arranged in one pixel P and the second capacitance electrode 77 that is arranged in the pixel P which is adjacent thereto. That is, the first capacitance electrode 71 includes the portion which does not overlap with the second capacitance electrode 77 in the planar view, and the portion which overlaps with the second capacitance electrode 77 in the planar view. The first capacitance electrode 71 of the portion which does not overlap with the second capacitance electrode 77 in the planar view, is covered (protected) by the rectangular-shaped second protective insulating film 47.

As illustrated in FIG. 5, the scan line 12 and an underlying insulating film 41 are arranged in sequence from the element substrate main body 11 side, between the element substrate main body 11 and the semiconductor layer 31.

The scan line 12 is formed on the element substrate main body 11. For example, the scan line 12 includes at least one of high melting point metals such as titanium (Ti), chromium (Cr), tungsten (W), tantalum (Ta), molybdenum (Mo) and palladium (Pd), and is made up of a light-shielding material such as a metal simple substance, an alloy, a metal silicide, a polysilicide, or a material which is obtained by stacking those. The scan line 12 is a light-shielding film which is positioned on a lower side of the TFT 30, so as to shield the semiconductor layer 31 of the TFT 30 from the light which is incident from the element substrate main body 11.

For example, the underlying insulating film 41 is configured of the silicon oxide, and is arranged on the entire face of the element substrate main body 11 by covering the scan line 12, and makes an interlayer insulating between the scan line 12 and the TFT 30. The underlying insulating film 41 also has the function of preventing the properties of the TFT 30 from deteriorating due to the roughness at the time of polishing the surface of the element substrate main body 11 or the dirt which is left after washing.

On the underlying insulating film 41, the semiconductor layer 31 is formed into the island shape. For example, the semiconductor layer 31 is configured of polycrystalline silicon, and is positioned counter to the scan line 12 through the underlying insulating film 41. Impurity ions are injected into the semiconductor layer 31, and the source region (high concentration impurity region) 32, the source side bonding region (low concentration impurity region) 33, the channel region 34, the drain side bonding region (low concentration impurity region) 35 and the drain region (high concentration impurity region) 36 are formed.

The semiconductor layer 31 is covered by the first insulating film 42. For example, the first insulating film 42 is configured of the silicon oxide, and is a gate insulating film of the TFT 30. On the first insulating film 42, the gate electrode 37 which overlaps with the channel region 34 of the semiconductor layer 31 in the planar view is formed. For example, the gate electrode 37 is formed of the polycrystalline silicon having conductivity, and is electrically connected to the scan line 12 through contact holes 51 and 52 (see FIG. 4) which penetrate the first insulating film 42 and the underlying insulating film 41.

The first insulating film 42 and the gate electrode 37 are covered by the second insulating film 43. For example, the second insulating film 43 is configured of the silicon oxide. Furthermore, the data line 6 and the drain electrode 38 are formed on the second insulating film 43. The data line 6 and the drain electrode 38 are formed of the same material as the scan line 12, and have the light-shielding properties.

The data line 6 is electrically connected to the source region 32 of the semiconductor layer 31, through the contact hole 53 penetrating the first insulating film 42 and the second insulating film 43. The drain electrode 38 is electrically connected to the drain region 36 of the semiconductor layer 31, through the contact hole 54 penetrating the first insulating film 42 and the second insulating film 43.

The data line 6 and the drain electrode 38 are covered by a third insulating film 44. For example, the third insulating film 44 is configured of the silicon oxide. For example, the third insulating film 44 is subjected to a flattening treatment by a chemical mechanical polishing treatment.

On the third insulating film 44, the first capacitance electrode 71, a dielectric film 75, and the second capacitance electrode 77 are stacked in sequence.

Furthermore, a first protective insulating film 74 which covers the side wall of a first metal film 72 and exposes at least a portion of the side wall of a second metal film 73, is formed on the third insulating film 44. In other words, the first protective insulating film 74 is formed so as to cover the portion of the side wall of the first capacitance electrode 71. That is, the first protective insulating film 74 is a side wall which is arranged so as to cover the portion of the side wall of the first capacitance electrode 71.

For example, the first protective insulating film 74 is configured of the silicon oxide.

The first capacitance electrode 71 is configured of the first metal film 72, and the second metal film 73 which is stacked in the first metal film 72. That is, the first capacitance electrode 71 is arranged above the element substrate main body 11, and includes the first metal film 72, and the second metal film 73 which is stacked in the first metal film 72. For example, the first metal film 72 is configured of aluminum being a low resistance material, and is formed on the third insulating film 44. For example, the second metal film 73 is configured of a titanium nitride, and is stacked on the first metal film 72.

As described above, the first capacitance electrode 71 is a capacitance line which is formed throughout the plurality of pixels P, and the fixed potential (for example, common potential Vcom) is supplied thereto. In order to suppress the potential change of the first capacitance electrode 71, the first capacitance electrode 71 includes the first metal film 72 that is configured of aluminum being the low resistance material, and lowering of the resistance is achieved.

The first capacitance electrode 71 is one electrode (fixed potential side capacitance electrode) which forms the storage capacitor 70. Furthermore, the first capacitance electrode 71 functions as a shield layer which overlaps with the data line 6 in the planar view, and suppresses an influence of an electric field of the data line 6. That is, since the first capacitance electrode 71 to which the fixed potential is supplied is arranged between the pixel electrode 9 and the data line 6, the influence of the electric field of the data line 6, namely, a coupling of the data line 6 and the pixel electrode 9 becomes small, and it is possible to enhance the display quality.

The dielectric film 75 is formed so as to cover the first capacitance electrode 71 and the third insulating film 44. That is, the dielectric film 75 is arranged throughout the side wall of the second metal film 73 which is exposed from the first protective insulating film 74, and over the second metal film 73.

For example, the dielectric film 75 is a multilayer film where an aluminum oxide ($Al_2O_3$) and a hafnium oxide ($HfO_2$) are stacked. That is, the dielectric film 75 is configured of the material having a high dielectric constant (high refractive index) in comparison with the silicon oxide. In the portion where the dielectric film 75 and the third insulating film 44 are stacked, a contact hole 55 reaching the drain electrode 38 is formed.

Furthermore, the dielectric film 75 may be a monolayer film which is made up of the silicon oxide, the silicon nitride, the hafnium oxide ($HfO_2$), a tantalum oxide ($Ta_2O_5$) or the like, or may be a multilayer film where the monolayer films are stacked.

The second capacitance electrode 77 is arranged throughout the dielectric film 75 (dielectric film 75 covering the surface of the first capacitance electrode 71) on the second metal film 73, and over the dielectric film 75 that is arranged in the side wall of the second metal film 73 which is exposed from the first protective insulating film 74. For example, the second capacitance electrode 77 is configured of the titanium nitride.

The storage capacitor 70 is formed of the first capacitance electrode 71 (fixed potential side capacitance electrode), the dielectric film 75, and the second capacitance electrode 77 (pixel potential side capacitance electrode). Since the portion of the side wall of the first capacitance electrode 71 is not covered by the first protective insulating film 74 and is covered by the dielectric film 75, the storage capacitor 70 is formed not only between the surface of the first capacitance electrode 71 and the dielectric film 75 and the second capacitance electrode 77, but also between the side wall (side wall of the second metal film 73) of the first capacitance electrode 71 which is not covered by the first protective insulating film 74 and the dielectric film 75 and the second capacitance electrode 77. Accordingly, it is possible to make a capacitance value of the storage capacitor 70 be large, in comparison with a case where the storage capacitor 70 is formed only between the surface of the first capacitance electrode 71 and the dielectric film 75 and the second capacitance electrode 77.

The second capacitance electrode 77 is covered by a fourth insulating film 45. For example, the fourth insulating film 45 is configured of the silicon oxide, and is subjected to the flattening treatment by the chemical mechanical polishing treatment.

On the fourth insulating film 45, the pixel electrode 9 and the alignment film 39 are stacked in sequence. For example, the pixel electrode 9 is configured of the transparent conductive film such as ITO. The pixel electrode 9 is electrically connected to the second capacitance electrode 77, through a contact hole 56 penetrating the fourth insulating film 45. That is, the pixel electrode 9 is electrically connected to the drain region 36 of the semiconductor layer 31, through the contact hole 56, the second capacitance electrode 77, the contact hole 55, the drain electrode 38 and the contact hole 54.

As illustrated in FIG. 6, the first capacitance electrode 71 includes a portion (first capacitance electrode 71A) which overlaps with the second capacitance electrode 77 in the planar view, and a portion (first capacitance electrode 71B) which does not overlap with the second capacitance electrode 77 in the planar view.

On the first capacitance electrode 71A, the dielectric film 75 and the second capacitance electrode 77 are stacked, and the storage capacitor 70 is formed. The first capacitance electrode 71B is covered (protected) by the second protective insulating film 47.

The second protective insulating film 47 is formed between the first capacitance electrode 71A of the portion which is close to the first capacitance electrode 71B and the dielectric film 75. That is, the second protective insulating film 47 is positioned between the first capacitance electrode 71 and the dielectric film 75, and is formed so as to cover the first capacitance electrode 71 of the portion which does not overlap with the second capacitance electrode 77 in the planar view.

As illustrated in FIG. 5 and FIG. 6, since the scan line 12, the data line 6, the first capacitance electrode 71, the second capacitance electrode 77 and the drain electrode 38 have the light-shielding properties, the region where the scan line 12, the data line 6, the first capacitance electrode 71, the second capacitance electrode 77 and the drain electrode 38 are positioned, becomes a light-shielding region V1. The region where the scan line 12, the data line 6, the first capacitance electrode 71, the second capacitance electrode 77 and the drain electrode 38 are not positioned, becomes a light-transmitting region V2. The pixel electrode 9 is positioned so as to cover the light-transmitting region V2 in the planar view. In the light-transmitting region V2, the light is modulated between the pixel electrode 9 and the counter electrode 22.

In the light-transmitting region V2, the underlying insulating film 41, the first insulating film 42, the second insulating film 43, the third insulating film 44 and the fourth insulating film 45 are positioned in sequence from the element substrate main body 11 side, between the element substrate main body 11 and the pixel electrode 9. That is, the insulating films which have the same refractive indexes as that of the silicon oxide by being configured of the silicon oxides, are positioned between the element substrate main body 11 and the pixel electrode 9.

If the insulating film having the refractive index which is different from that of the silicon oxide is positioned between the element substrate main body 11 and the pixel electrode 9, the reflection of the light is generated at an interface between the insulating film which is configured of the silicon oxide and the insulating film having the refractive index which is different from that of the silicon oxide, and usage efficiency of the light is lowered in the liquid crystal device 100.

Hence, the dielectric film 75 which is extended from the second capacitance electrode 77, is removed by an etching so that the dielectric film 75 which is configured of the material having the refractive index higher than that of the silicon oxide is not positioned in the light-transmitting region V2. That is, the dielectric film 75 is positioned in the light-shielding region V1, and is not positioned in the light-transmitting region V2. Since the dielectric film 75 is not positioned in the light-transmitting region V2, the reflection of the light is suppressed by positioning the insulating films of which the refractive indexes are different from each other, and it is possible to enhance the usage efficiency of the light in the liquid crystal device 100, in comparison with the case where the dielectric film 75 is positioned in the light-transmitting region V2.

Furthermore, as described above, in the liquid crystal device 100 according to Embodiment 1, the storage capacitor 70 is formed not only between the surface of the first capacitance electrode 71 and the dielectric film 75 and the second capacitance electrode 77, but also between the side wall (side wall of the second metal film 73) of the first capacitance electrode 71 which is not covered by the first protective insulating film 74 and the dielectric film 75 and the second capacitance electrode 77, and the capacitance value of the storage capacitor 70 becomes large, in comparison with the case where the storage capacitor 70 is formed only between the surface of the first capacitance electrode 71 and the dielectric film 75 and the second capacitance electrode 77. Accordingly, retention properties (potential retention properties of the pixel P) of the image signal which is written into the pixel electrode 9 is improved in comparison with the case where the capacitance value of the storage capacitor 70 is small, and it is possible to provide the display of high quality.

Method for Manufacturing Liquid Crystal Device

Figure 7:
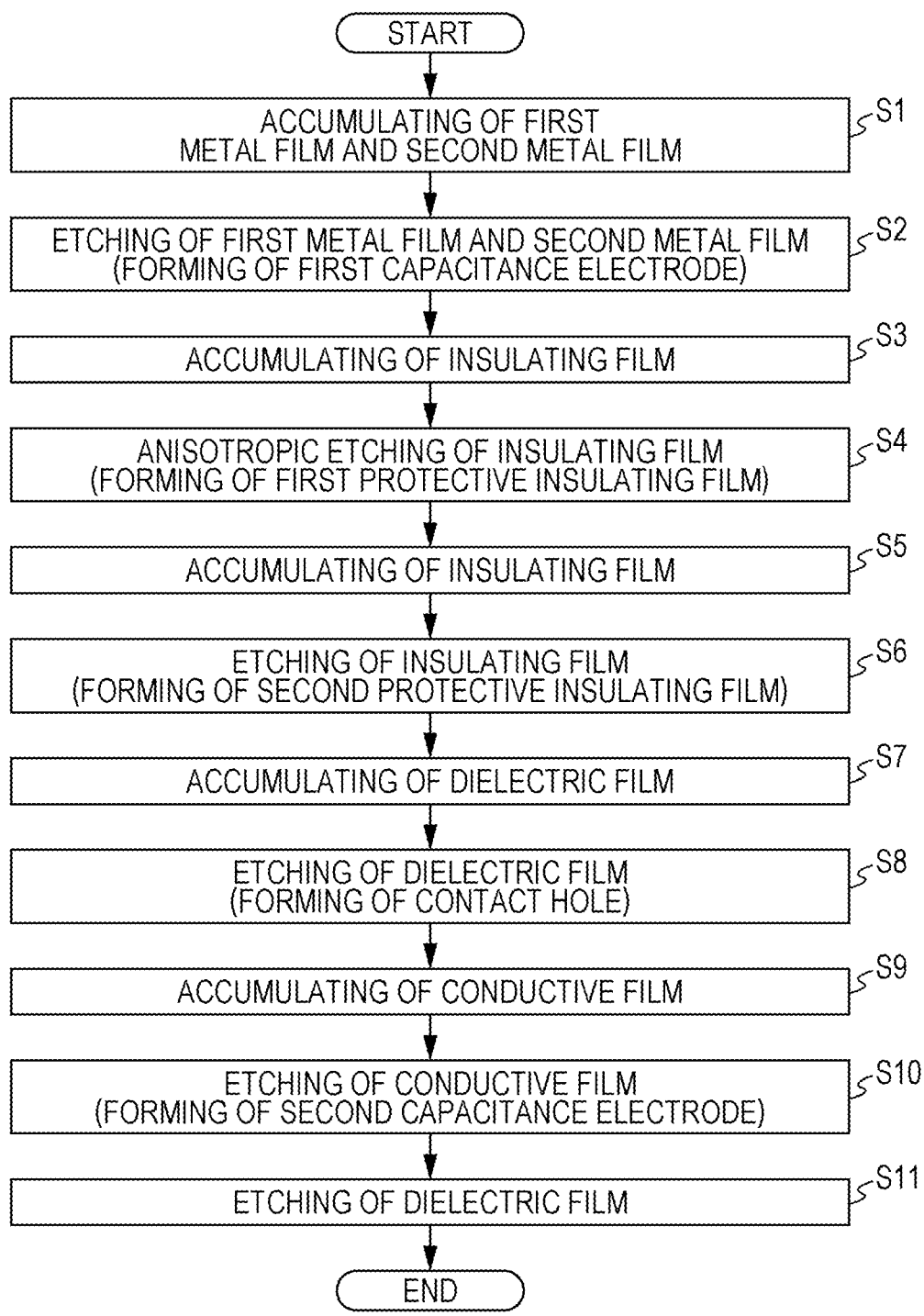
FIG. 7 is a process flow illustrating a method for manufacturing the liquid crystal device according to Embodiment 1.

FIG. 7 is a process flow illustrating a method for manufacturing the liquid crystal device according to Embodiment 1. FIG. 8A to FIG. 8E and FIG. 9A to FIG. 9D are diagrams correlating with FIG. 5, and are schematic sectional views illustrating a state after passing through a main process of the process flow illustrated in FIG. 7.

In order to facilitate the understanding of features of Embodiment 1, in FIG. 8A to FIG. 8E and FIG. 9A to FIG. 9D, the portion where the storage capacitor 70 (first capacitance electrode 71, dielectric film 75, second capacitance electrode 77) is formed is illustrated by being enlarged in comparison with FIG. 5. Furthermore, the illustration of the component which is positioned between the element substrate main body 11 and the first capacitance electrode 71, is omitted in FIG. 8A to FIG. 8E and FIG. 9A to FIG. 9D.

Hereinafter, an outline of the method for manufacturing the liquid crystal device 100 according to Embodiment 1, will be described with reference to FIG. 7 to FIG. 9D.

As illustrated in FIG. 7, the method for manufacturing the liquid crystal device 100 according to Embodiment 1, includes depositing of the first metal film 72 and the second metal film 73 in sequence (step S1), forming of the first capacitance electrode 71 by etching the second metal film 73 and the first metal film 72 in sequence (step S2), depositing of an insulating film 74A (step S3), forming of the first protective insulating film 74 by performing an anisotropic etching of the insulating film 74A in a Z(−) direction (step S4), depositing of an insulating film (step S5), forming of the second protective insulating film 47 by etching the insulating film (step S6), depositing of the dielectric film 75 (step S7), forming of the contact hole 55 by etching the dielectric film 75 (step S8), depositing of a conductive film 77A (step S9), forming of the second capacitance electrode 77 by etching the conductive film 77A (step S10), and removing of the dielectric film 75 by etching the dielectric film 75 which is extended from the second capacitance electrode 77 (step S11).

Figure 8A:
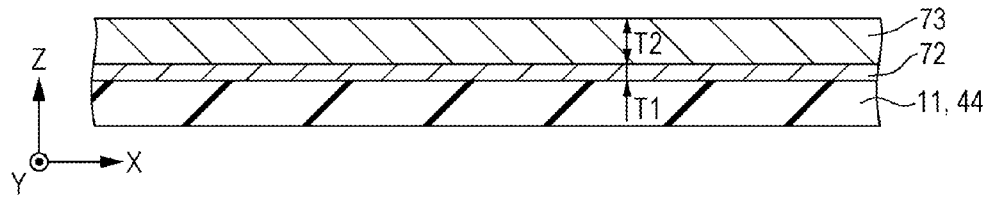
FIG. 8A to FIG. 8E are schematic sectional views illustrating a state after passing through a main process of the process flow illustrated in FIG. 7.

As illustrated in FIG. 8A, in the step S1, the first metal film 72 which is made up of aluminum and the second metal film 73 which is made up of the titanium nitride are deposited in sequence, above the element substrate main body 11 (on the third insulating film 44), for example, by a sputtering method. A film thickness T1 of the first metal film 72 is approximately 50 nm to 500 nm, and a film thickness T2 of the second metal film 73 is approximately 100 nm to 500 nm. The film thickness T2 of the second metal film 73 is the same as the film thickness T1 of the first metal film 72, or is greater than the film thickness T1 of the first metal film 72.

In this manner, in the step S1, the first metal film 72 and the second metal film 73 are deposited in sequence so that the film thickness T2 of the second metal film 73 is the same as the film thickness T1 of the first metal film 72, or is greater than the film thickness T1 of the first metal film 72.

As described above, since the lowering of the resistance of the first capacitance electrode 71 is achieved by the first metal film 72, the film thickness T1 of the first metal film 72 is made to be great in order to make the resistance of the first capacitance electrode 71 be low, and for example, the configuration is preferably that the film thickness T1 of the first metal film 72 is the same as the film thickness T2 of the second metal film 73.

Furthermore, since the storage capacitor 70 is also formed in the side wall (side wall of the first capacitance electrode 71) of the second metal film 73, the configuration is preferably that the film thickness T2 of the second metal film 73 is greater than the film thickness T1 of the first metal film 72, in order to achieve the capacitance enlargement of the storage capacitor 70.

In Embodiment 1, the film thickness T2 of the second metal film 73 is greater than the film thickness T1 of the first metal film 72, and the configuration which is suitable in order to achieve the capacitance enlargement of the storage capacitor 70 is included.

Figure 8B:
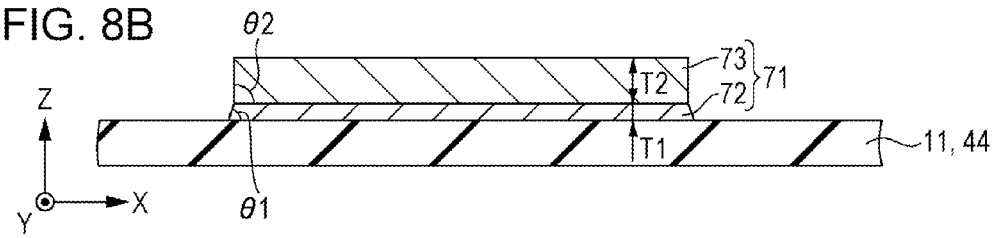

As illustrated in FIG. 8B, in the step S2, the second metal film 73 and the first metal film 72 are etched in sequence, for example, by a dry etching method using a capacitance coupling type dry etching device such as a reactive ionic etching (RIE) device, and the first capacitance electrode 71 is formed.

Specifically, the second metal film 73 is etched in the Z(−) direction, by the dry etching method using chlorine-based gas. Although the details thereof will be described later, in order to stably form the first protective insulating film 74 so that at least the portion of the side wall of the second metal film 73 is exposed, it is preferable that the side wall of the second metal film 73 has a sheer shape with respect to the element substrate main body 11 (third insulating film 44). That is, it is preferable that an angle θ2 which is made by the second metal film 73 and the X direction (direction along the surface of the element substrate main body 11), is greater than an angle θ1 which is made by the first metal film 72 and the X direction, and is close to 90 degrees.

Subsequently, by the dry etching method using the chlorine-based gas, the first metal film 72 is etched in the Z(−) direction. That is, by the dry etching method using the chlorine-based gas, the second metal film 73 is used as an etching mask, and the first metal film 72 is etched. In order to improve a step coverage ability (step coatability) with respect to the first capacitance electrode 71 of the insulating film 74A which is deposited in the step S3, it is preferable that a slope of the side wall of the first metal film 72 is forward tapered. That is, it is preferable that the angle θ1 which is made by the first metal film 72 and the X direction is smaller than the angle θ2 which is made by the second metal film 73 and the X direction.

In the step S2, by etching the first metal film 72 in the Z(−) direction while moving back the second metal film 73 in the direction intersecting with the Z(−) direction, the first metal film 72 is formed so that the angle θ1 which is made by the X direction and the side wall of the first metal film 72 is smaller than the angle θ2 which is made by the X direction and the side wall of the second metal film 73.

Furthermore, in the dry etching method using the chlorine-based gas, by changing conditions such as composition of the etching gas, pressure, power of high frequency power source which generates plasma, and a temperature, it is possible to control an etching shape of the second metal film 73 or the first metal film 72.

Figure 8C:
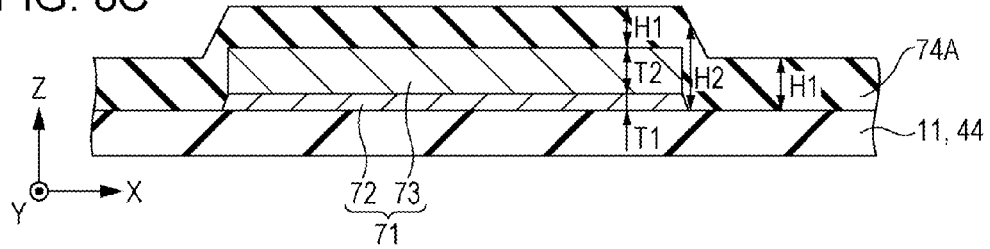

As illustrated in FIG. 8C, in the step S3, the silicon oxide is deposited by a film formation method which is excellent in step coatability such as a plasma CVD using tetraethoxysilane (TEOS), and the insulating film 74A covering the first capacitance electrode 71 is formed.

The film thickness of the insulating film 74A which is deposited on the surface of the first capacitance electrode 71, and the film thickness of the insulating film 74A which is deposited on the surface of the third insulating film 44 are H1 (approximately 200 nm to 1000 nm) together. The film thickness of the insulating film 74A covering the side wall (step portion) of the first capacitance electrode 71 is H2, and is greater than the above H1 (approximately 200 nm to 1000 nm).

If the side wall of the second metal film 73 has the sheer shape with respect to the element substrate main body 11 (third insulating film 44), the film thickness H2 of the insulating film 74A covering the side wall of the first capacitance electrode 71 becomes greater than the film thickness H1 of the insulating film 74A which is deposited on the surface of the first capacitance electrode 71, and the film thickness H1 of the insulating film 74A which is deposited on the surface of the third insulating film 44. That is, in order to make the film thickness H2 of the insulating film 74A covering the side wall of the first capacitance electrode 71 be greater than the film thickness H1 of the insulating film 74A which is deposited on the surface of the first capacitance electrode 71, and the film thickness H1 of the insulating film 74A which is deposited on the surface of the third insulating film 44, it is preferable that the side wall of the second metal film 73 has the sheer shape with respect to the element substrate main body 11 (third insulating film 44).

Figure 8D:
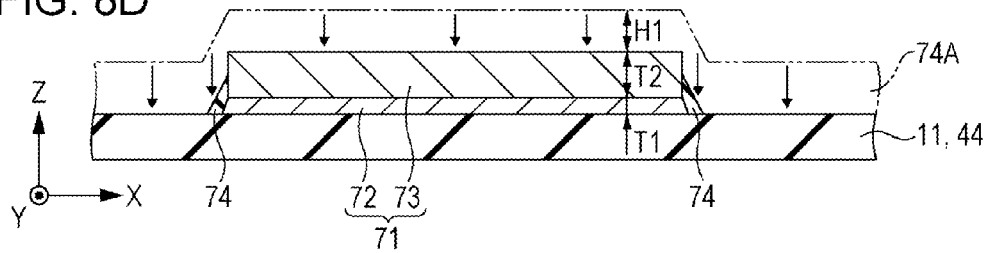

In FIG. 8D, a contour of the insulating film 74A before etching is illustrated by the two-dot chain line, and the contour of the insulating film 74A (first protective insulating film 74) after etching is illustrated by the solid line. As illustrated in FIG. 8D, in the step S4, for example, fluorine-based gas is used as reactive gas, and by the dry etching method using the capacitance coupling type dry etching device such as the RIE device, the anisotropic etching of the insulating film 74A is performed in the Z(−) direction, and the first protective insulating film 74 is formed.

In the step S4, the anisotropic etching of the Z(−) direction is performed with respect to the insulating film 74A, under the condition that an etching amount (etching depth) is greater than H1 (film thickness of the insulating film 74A which is deposited on the surface of the first capacitance electrode 71). That is, the anisotropic etching of the Z(−) direction is performed with respect to the insulating film 74A so that the insulating film 74A which is deposited on the surface of the first capacitance electrode 71 and the insulating film 74A which is deposited on the surface of the third insulating film 44 are removed, and the insulating film 74A covering the side wall of the first capacitance electrode 71 is left.

By such the anisotropic etching of the Z(−) direction, the contour of the insulating film 74A which is illustrated by the two-dot chain line is moved in an arrow direction of FIG. 8D, and the first protective insulating film 74 is formed, so as to cover the side wall of the first metal film 72, and expose at least the portion of the side wall of the second metal film 73.

The first metal film 72 is configured of aluminum, and a tolerance thereof with respect to a drug solution such as hydrofluoric acid is weak. The second metal film 73 is configured of the titanium nitride, and the tolerance thereof with respect to the drug solution such as hydrofluoric acid is strong. The side wall of the first metal film 72 is covered by the first protective insulating film 74, and the surface of the first metal film 72 is covered by the second metal film 73. That is, since the first metal film 72 is covered (protected) by the first protective insulating film 74 and the second metal film 73, the tolerance thereof with respect to the drug solution such as hydrofluoric acid is improved, and the first metal film 72 is not affected by the drug solution containing hydrofluoric acid which is used in the step S6 described later.

In this manner, since the side wall of the second metal film 73 has the sheer shape with respect to the element substrate main body 11 (third insulating film 44), the film thickness H2 of the insulating film 74A covering the side wall of the first capacitance electrode 71 becomes greater than the film thickness H1 of the insulating film 74A which is deposited on the surface of the first capacitance electrode 71, and the film thickness H1 of the insulating film 74A which is deposited on the surface of the third insulating film 44. Furthermore, by performing the anisotropic etching of the Z(−) direction with respect to the insulating film 74A, it is possible to form the first protective insulating film 74 which covers the side wall of the first metal film 72, and exposes at least the portion of the side wall of the second metal film 73.

Accordingly, in order to stably form the first protective insulating film 74, it is preferable that the side wall of the second metal film 73 has the sheer shape with respect to the element substrate main body 11 (third insulating film 44), that is, the angle θ2 which is made by the second metal film 73 and the X direction is greater than the angle θ1 which is made by the first metal film 72 and the X direction.

Furthermore, in order to perform the anisotropic etching of the Z(-) direction with respect to the insulating film 74A, a dielectric coupling type dry etching device (for example, inductive coupled plasma dry etching device), an electromagnetic wave incidence type dry etching device (for example, electron cyclotron resonance type dry etching device) or the like may be used, in addition to the capacitance coupling type dry etching device.

In the step S5, for example, an insulating film which is made up of the silicon oxide is deposited by the plasma CVD using TEOS (the illustration thereof is omitted).

In the step S6, for example, the fluorine-based gas is used as reactive gas, and by the dry etching method using the capacitance coupling type dry etching device, the insulating film which is made up of the silicon oxide is etched, and the second protective insulating film 47 (see FIG. 6) covering the first capacitance electrode 71 (first capacitance electrode 71B) of the portion which does not overlap with the second capacitance electrode 77 in the planar view is formed.

In this manner, the second protective insulating film 47 covering the first capacitance electrode 71 (first capacitance electrode 71B) of the portion which does not overlap with the second capacitance electrode 77 in the planar view is formed, by the depositing of the insulating film (step S5) and the etching of the insulating film (step S6) which are arranged between the forming of the first protective insulating film 74 (step S4) and the depositing of the dielectric film 75 described later (step S7).

Furthermore, in the step S6, the first capacitance electrode 71A (second metal film 73, see FIG. 6) which is not covered by the second protective insulating film 47 is exposed to the plasma of the reactive gas (fluorine-based gas) for etching the insulating film (silicon oxide), and a deposition material (reaction product) such as a carbon-based polymer which is generated in a process of etching the insulating film (silicon oxide) is deposited. Hence, there is a need of removing the reaction product which is deposited in the first capacitance electrode 71A (second metal film 73) by the drug solution containing hydrofluoric acid.

As described above, the tolerance of the first metal film 72 (aluminum) with respect to the drug solution such as hydrofluoric acid is weak, and the tolerance of the second metal film 73 (titanium nitride) with respect to the drug solution such as hydrofluoric acid is strong.

Since the first metal film 72 is covered (protected) by the first protective insulating film 74 and the second metal film 73, the first metal film 72 is not affected by the drug solution containing hydrofluoric acid. That is, it is possible to remove the reaction product which is deposited in the first capacitance electrode 71A (second metal film 73), without having an adverse effect such as corrosion on the first metal film 72 by the drug solution containing hydrofluoric acid.

Figure 8E:
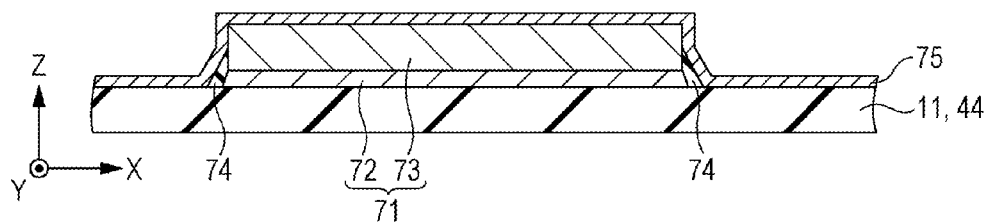

As illustrated in FIG. 8E, in the step S7, for example, a hafnium oxide film and an aluminum oxide film are stacked in sequence by using an atomic layer deposition (ALD) method, and the dielectric film 75 covering the first capacitance electrode 71 is formed. That is, the dielectric film 75 has a two-layered structure which is made up of the hafnium oxide film and the aluminum oxide film. The film thickness of the dielectric film 75 is approximately 20 nm to 50 nm.

If being a multilayer film where the hafnium oxide film and the aluminum oxide film are alternately stacked, the dielectric film 75 may have a three-layered structure or a five-layered structure, in addition to the two-layered structure described above.

In the ALD method, tetraethyl methylamino hafnium (TEMA-Hf) gas being a supply source of hafnium is introduced into a film formation chamber, and TEMA-Hf or an active species thereof is chemisorbed in the surface of a target material (for example, the first capacitance electrode 71). Next, ozone gas is introduced into the film formation chamber, and the hafnium oxide film of one atomic layer is formed, by thermally reacting the ozone gas with TEMA-Hf which is adsorbed in the surface of the target material. Similarly, trimethyl aluminum (TMA) gas being the supply source of aluminum is introduced into the film formation chamber, and TMA or the active species thereof is chemisorbed in the surface of the target material (for example, hafnium oxide film). Next, the ozone gas is introduced into the film formation chamber, and the aluminum oxide film of one atomic layer is formed, by thermally reacting the ozone gas with TMA which is adsorbed in the surface of the target material.

By repeating operations described above, the hafnium oxide film or the aluminum oxide film having a predetermined film thickness is formed. In the ALD method, it is possible to control the film thickness on one atomic layer level, and it is possible to form the hafnium oxide film or the aluminum oxide film having the predetermined film thickness with high accuracy.

Figure 9A:
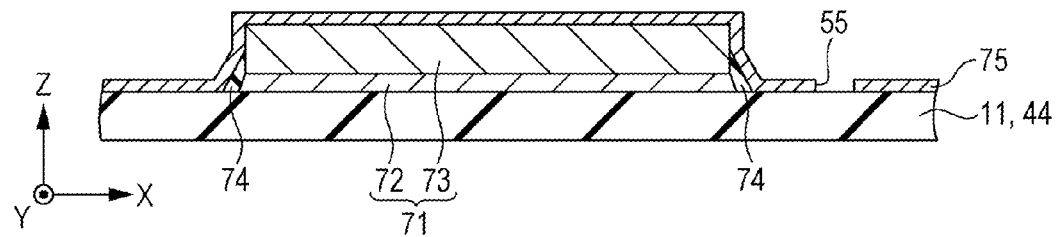
FIG. 9A to FIG. 9D are schematic sectional views illustrating the state after passing through the main process of the process flow illustrated in FIG. 7.

As illustrated in FIG. 9A, in the step S8, for example, the fluorine-based gas is used as reactive gas, and by the dry etching method using the capacitance coupling type dry etching device, the dielectric film 75 is etched, and the contact hole 55 penetrating the dielectric film 75 is formed. Specifically, in the step S8, the contact hole 55 (see FIG. 5) which penetrates the dielectric film 75 and the third insulating film 44, and reaches the drain electrode 38 is formed, by etching the dielectric film 75 and the third insulating film 44.

Figure 9B:
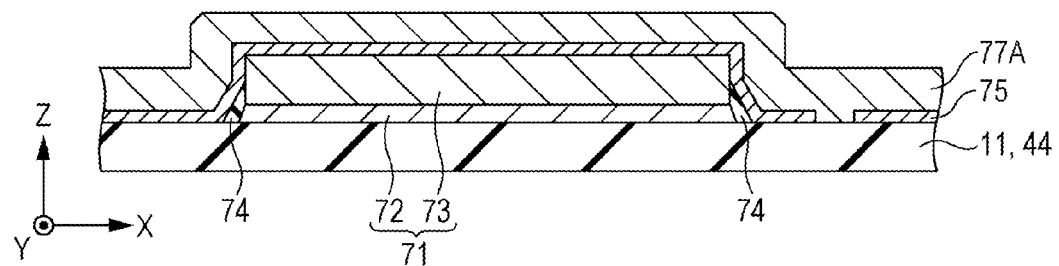

As illustrated in FIG. 9B, in the step S9, for example, the conductive film 77A which is made up of the titanium nitride by the sputtering method, is deposited on the dielectric film 75. The film thickness of the conductive film 77A is approximately 100 nm to 500 nm.

Furthermore, for example, the material configuring the conductive film 77A may be the metal simple substance including at least one of high melting point metals such as titanium, chromium, tungsten, tantalum and molybdenum, the metal silicide, the polysilicide, or the material which is obtained by stacking those, in addition to the titanium nitride. Moreover, the material configuring the conductive film 77A may be the polycrystalline silicon of conductivity.

Figure 9C:
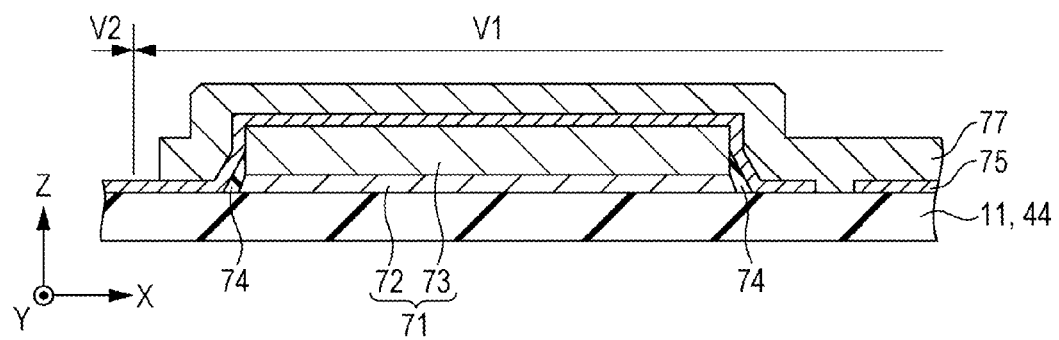

As illustrated in FIG. 9C, in the step S10, for example, the chlorine-based gas is used as reactive gas, and by the dry etching method using the capacitance coupling type dry etching device, the conductive film 77A is etched, and the second capacitance electrode 77 is formed. Furthermore, the light-transmitting region V2 is positioned in an outside (X(-) direction side of FIG. 9C) of the second capacitance electrode 77.

Figure 9D:
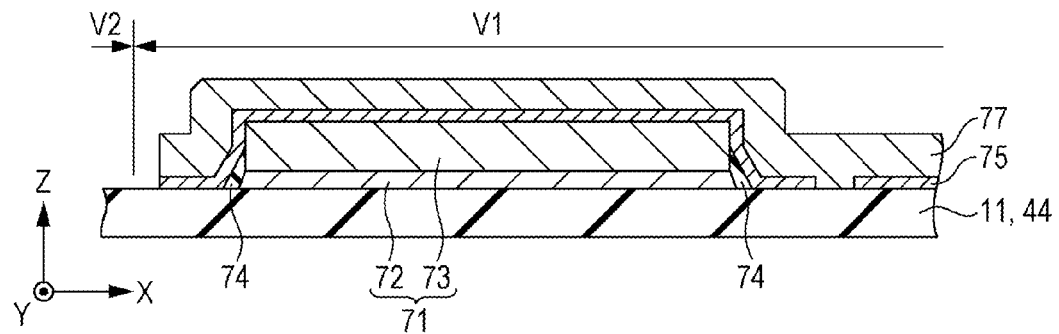

As illustrated in FIG. 9D, in the step S11, for example, the fluorine-based gas is used as reactive gas, and by the dry etching method using the capacitance coupling type dry etching device, the second capacitance electrode 77 is used as an etching mask, and the dielectric film 75 which is extended from the second capacitance electrode 77 is etched, and is removed. That is, the dielectric film 75 is removed by etching the dielectric film 75 which is extended from the second capacitance electrode 77 so that the dielectric film 75 is not positioned in the light-transmitting region V2.

Since the dielectric film 75 having the high refractive index as compared with the insulating films (underlying insulating film 41, first insulating film 42, second insulating film 43, third insulating film 44, fourth insulating film 45 (see FIG. 5)) which are configured of the silicon oxides is not positioned in the light-transmitting region V2, the reflection of the light is suppressed at the interface where the insulating films of which the refractive indexes are different from each other are positioned, and it is possible to enhance the usage efficiency of the light in the liquid crystal device 100.

Furthermore, the element substrate 10 illustrated in FIG. 5 is formed, through the forming of the fourth insulating film 45, the forming of the pixel electrode 9, and the forming of the alignment film 39.

Embodiment 2

Figure 10:
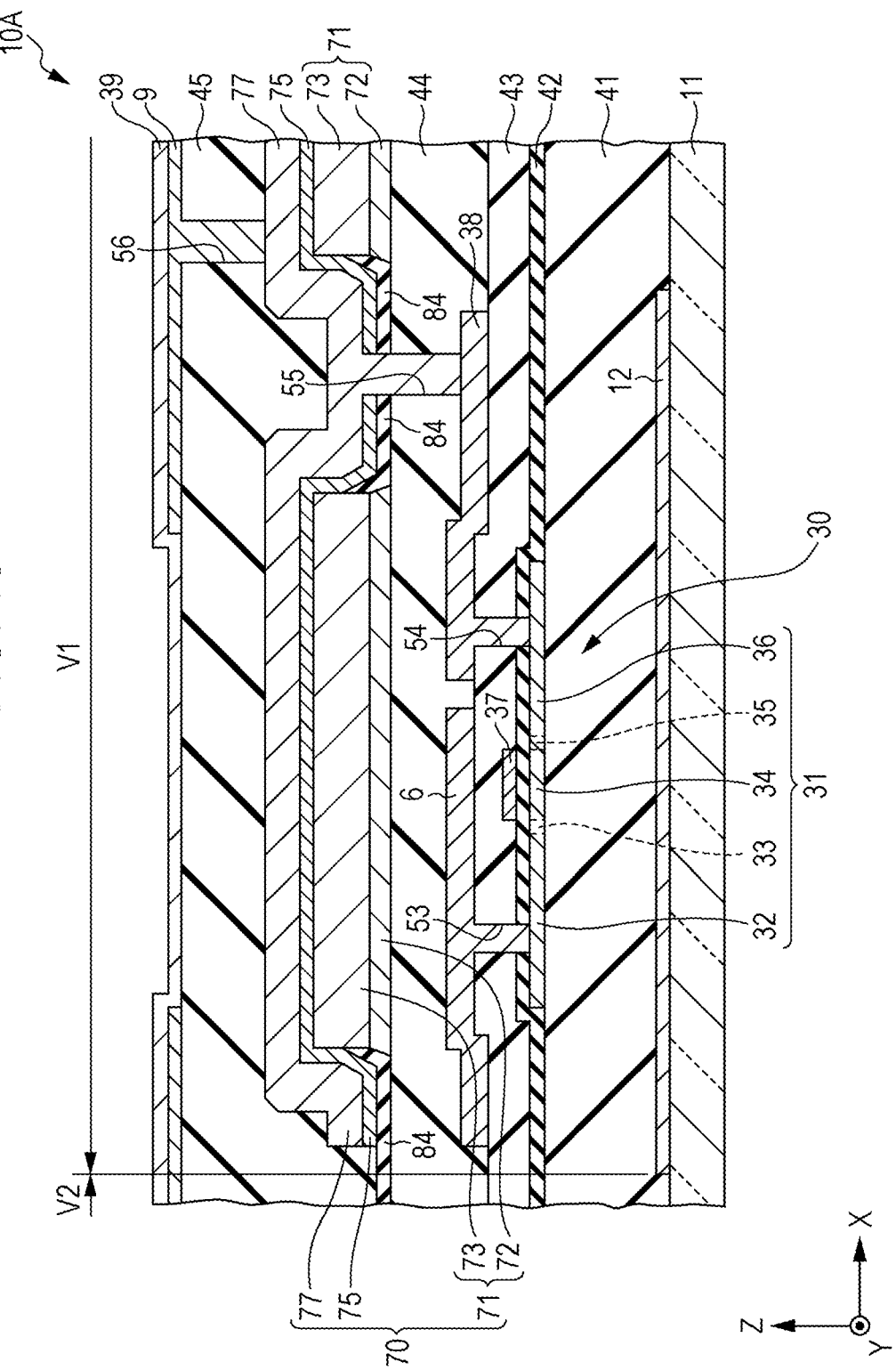
FIG. 10 is a schematic sectional view of an element substrate of a liquid crystal device according to Embodiment 2.

FIG. 10 is a diagram correlating with FIG. 5, and is a schematic sectional view of an element substrate of a liquid crystal device according to Embodiment 2. FIG. 11 is a diagram correlating with FIG. 7, and is a process flow illustrating a method for manufacturing the liquid crystal device according to Embodiment 2. FIG. 12A to FIG. 12E are diagrams correlating with FIG. 8A to FIG. 8E, and are schematic sectional views illustrating a state after passing through a main process of the process flow illustrated in FIG. 11.

In Embodiment 2, the shape of the first protective insulating film 74, and the forming of the first protective insulating film 74 are different from Embodiment 1, and other configurations are the same as Embodiment 1.

Hereinafter, the outline of the liquid crystal device according to Embodiment 2 will be described with reference to FIG. 10 to FIG. 12E, centering around points which are different from Embodiment 1. Moreover, the same signs are attached to the components which are the same as Embodiment 1, and the overlapping description thereof is omitted.
Outline of Liquid Crystal Device As illustrated in FIG. 10, in an element substrate 10A of the liquid crystal device according to Embodiment 2, for example, a first protective insulating film 84 is configured of the silicon oxide, and is arranged so as to cover the side wall of the first metal film 72, and expose at least the portion of the side wall of the second metal film 73. In other words, the first protective insulating film 84 is arranged so as to cover the portion of the side wall of the first capacitance electrode 71, and includes the portion covering the side wall of the first metal film 72 and the portion of the side wall of the second metal film 73, and the portion covering the surface of the third insulating film 44. That is, the first protective insulating film 84 is formed so as to cover the surface of the third insulating film 44, and the point is different from the first protective insulating film 74 (see FIG. 5) of Embodiment 1.

The dielectric film 75 is positioned between the first protective insulating film 84 of the portion covering the surface of the third insulating film 44 and the second capacitance electrode 77. Hence, the contact hole 55 reaching the drain electrode 38 is formed by penetrating the dielectric film 75, the first protective insulating film 84, and the third insulating film 44.

The storage capacitor 70 is formed of the first capacitance electrode 71, the dielectric film 75, and the second capacitance electrode 77. Since the portion of the side wall of the first capacitance electrode 71 (second metal film 73) is not covered by the first protective insulating film 84, and is covered by the dielectric film 75, the storage capacitor 70 is formed not only between the surface of the first capacitance electrode 71 and the dielectric film 75 and the second capacitance electrode 77, but also between the side wall (side wall of the second metal film 73) of the first capacitance electrode 71 which is not covered by the first protective insulating film 84 and the dielectric film 75 and the second capacitance electrode 77. Accordingly, it is possible to make the capacitance value of the storage capacitor 70 be large, in comparison with the case where the storage capacitor 70 is formed only between the surface of the first capacitance electrode 71 and the dielectric film 75 and the second capacitance electrode 77.

Consequently, the retention properties (potential retention properties of the pixel P) of the image signal which is written into the pixel electrode 9 is improved, in comparison with the case where the capacitance value of the storage capacitor 70 is small, and it is possible to obtain the same effect as Embodiment 1 which can provide the high-quality display.

In the light-transmitting region V2, the underlying insulating film 41, the first insulating film 42, the second insulating film 43, the third insulating film 44, the first protective insulating film 84, and the fourth insulating film 45 are positioned in sequence from the element substrate main body 11 side, between the element substrate main body 11 and the pixel electrode 9. That is, in the light-transmitting region V2, the insulating films which are configured of the materials (silicon oxides) having the same refractive indexes to each other are arranged. The dielectric film 75 of the refractive index which is higher than that of the silicon oxide, is positioned in the light-shielding region V1, and is not positioned in the light-transmitting region V2.

Since the dielectric film 75 is not positioned in the light-transmitting region V2, the reflection of the light is suppressed by positioning the insulating films of which the refractive indexes are different from each other, in comparison with the case where the dielectric film 75 is positioned in the light-transmitting region V2, and it is possible to obtain the same effect as Embodiment 1 which can enhance the usage efficiency of the light in the liquid crystal device 100.

As illustrated in FIG. 11, the method for manufacturing the liquid crystal device according to Embodiment 2, includes the depositing of the first metal film 72 and the second metal film 73 in sequence (step S1), the forming of the first capacitance electrode 71 by etching the second metal film 73 and the first metal film 72 in sequence (step S2), the depositing of the insulating film 74A (step S3), performing of the chemical mechanical polishing treatment of the insulating film 74A (step S41), forming the first protective insulating film 84 by performing the anisotropic etching of the insulating film 74A in the Z(−) direction (step S42), the depositing of an insulating film (step S5), the forming of the second protective insulating film 47 by etching the insulating film (step S6), the depositing of the dielectric film 75 (step S7), the forming of the contact hole 55 by etching the dielectric film 75 (step S8), the depositing of the conductive film 77A (step S9), the forming of the second capacitance electrode 77 by etching the conductive film 77A (step S10), and the removing of the dielectric film 75 by etching the dielectric film 75 which is extended from the second capacitance electrode 77 (step S11).

The steps S1 to S3 of Embodiment 2 are the same as the steps S1 to S3 of Embodiment 1. The Steps S5 to S11 of Embodiment 2 are the same as the steps S5 to S11 of Embodiment 1.

The forming of the first protective insulating film 84 is configured by the performing of the chemical mechanical polishing treatment of the insulating film 74A (step S41), and the performing of the anisotropic etching of the insulating film 74A in the Z(−) direction (step S42), and the point is mainly different from Embodiment 1.

Figure 12A:
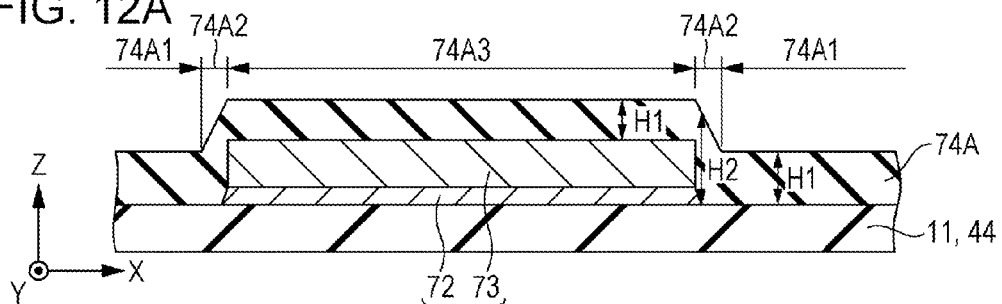
FIG. 12A to FIG. 12E are schematic sectional views illustrating a state after passing through a main process of the process flow illustrated in FIG. 11.

As illustrated in FIG. 12A, in the step S3, the silicon oxide is deposited by the film formation method which is excellent in step coatability such as the plasma CVD using TEOS, and the insulating film 74A covering the first capacitance electrode 71 is formed.

The insulating film 74A is configured of an insulating film 74A1 covering the surface of the third insulating film 44, an insulating film 74A2 covering the side wall (step portion) of the first capacitance electrode 71, and an insulating film 74A3 covering the surface of the first capacitance electrode 71. Furthermore, the insulating film 74A1 covering the surface of the third insulating film 44, forms a concave portion of the insulating film 74A. The insulating film 74A3 covering the surface of the first capacitance electrode 71, forms a convex portion of the insulating film 74A.

The film thickness of the insulating film 74A (insulating film 74A1) of the concave portion, and the film thickness of the insulating film 74A (insulating film 74A3) of the convex portion are H1 (approximately 200 nm to 1000 nm) together. The film thickness of the insulating film 74A (insulating film 74A2) at the boundary between the concave portion and the convex portion, is H2, and is greater than the film thickness H1 of the insulating film 74A of the concave portion and the convex portion.

Figure 12B:
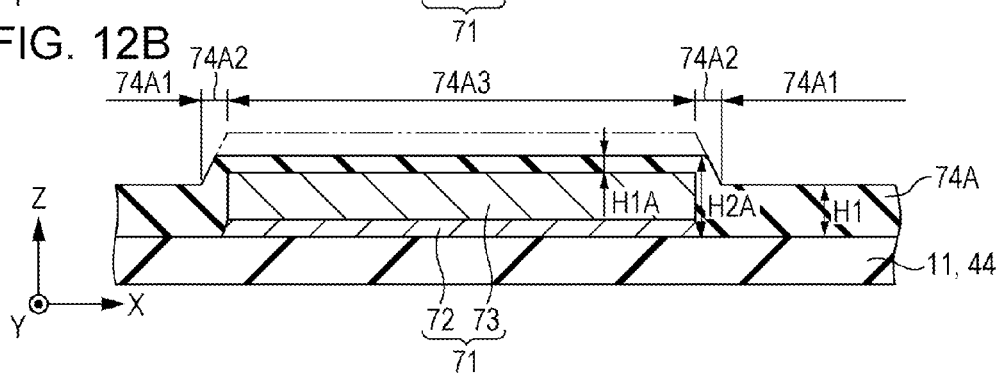

In FIG. 12B, the contour of the insulating film 74A before performing the chemical mechanical polishing (referred to as CMP, hereinafter) is illustrated by the two-dot chain line, and the contour of the insulating film 74A after performing CMP is illustrated by the solid line. Furthermore, CMP is a treatment of reducing the film thickness of the convex portion of a polishing target material, and reducing the surface unevenness of the polishing target material, by balancing a chemical action of a chemical ingredient which is contained in a polishing solution with a mechanical action due to a relative movement of a polishing agent and the polishing target material.

As illustrated in FIG. 12B, in the step S41, the insulating film 74A is subjected to CMP, and the contour of the insulating film 74A is changed to the state of the solid line from the state of the two-dot chain line.

Specifically, by the CMP treatment of the step S41, the film thickness of the insulating film 74A (insulating film 74A3) of the convex portion is reduced to H1A from H1, and the film thickness of the insulating film 74A (insulating film 74A2) at the boundary between the concave portion and the convex portion is reduced to H2A from H2. On the other hand, the film thickness of the insulating film 74A (insulating film 74A1) of the concave portion is not changed, and is maintained in the state of H1.

The film thickness of the insulating film 74A is increased in sequence of the film thickness H1A of the insulating film 74A (insulating film 74A3) of the convex portion, the film thickness H1 of the insulating film 74A (insulating film 74A1) of the concave portion, and the film thickness H2A of the insulating film 74A (insulating film 74A2) at the boundary between the concave portion and the convex portion.

Figure 12C:
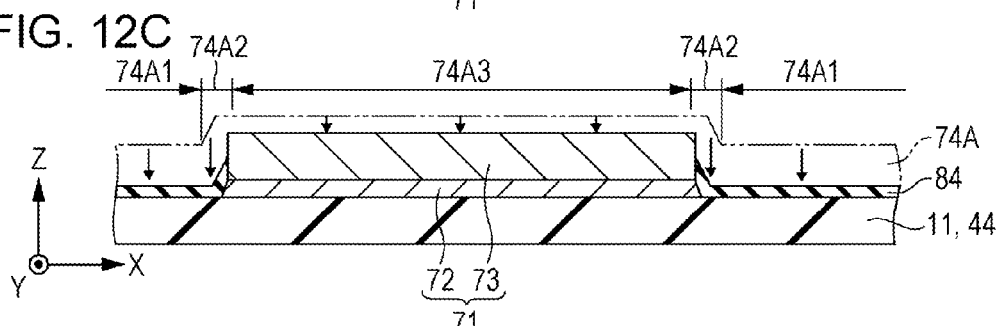

In FIG. 12C, the contour of the insulating film 74A before performing the anisotropic etching is illustrated by the two-dot chain line, and the contour of the insulating film 74A (first protective insulating film 84) after performing the anisotropic etching is illustrated by the solid line. As illustrated in FIG. 12C, in the step S42, for example, the fluorine-based gas is used as reactive gas, and by the dry etching method using the capacitance coupling type dry etching device, the anisotropic etching of the insulating film 74A is performed in the Z(−) direction.

Specifically, in the step S42, the anisotropic etching of the Z(−) direction is performed with respect to the insulating film 74A, under the condition that the etching amount (etching depth) is greater than H1A (film thickness of the insulating film 74A3). That is, the anisotropic etching of the Z(−) direction is performed with respect to the insulating film 74A so that the insulating film 74A (insulating film 74A3) of the convex portion is removed, and the insulating film 74A (insulating film 74A1) of the concave portion and the insulating film 74A (insulating film 74A2) at the boundary between the concave portion and the convex portion are left.

As a result, the contour of the insulating film 74A which is illustrated by the two-dot chain line is moved in the arrow direction of FIG. 12C, and the first protective insulating film 84 is formed, so as to cover the side wall of the first metal film 72, and expose at least the portion of the side wall of the second metal film 73.

In this manner, the forming of the first protective insulating film 84 is configured by the performing of CMP of the insulating film 74A (step S41), and the performing of the anisotropic etching of the insulating film 74A in the Z(−) direction (step S42).

The point that the step S42 of Embodiment 2 is different from the step S4 of Embodiment 1, is the etching amount which is obtained by performing the anisotropic etching of the insulating film 74A in the Z(−) direction. In the step S42, since the insulating film 74A (insulating film 74A3 of the convex portion) covering the surface of the first capacitance electrode 71 is thinned by CMP, the etching amount which is obtained by performing the anisotropic etching of the insulating film 74A in the Z(−) direction becomes small, and the etching time becomes short, in comparison with the step S4 of Embodiment 1. Accordingly, it is possible to enhance the productivity of the performing of the anisotropic etching of the insulating film 74A in the Z(−) direction.

Furthermore, since the etching amount which is obtained by performing the anisotropic etching of the insulating film 74A in the Z(−) direction becomes small, a variation in the etching amount of the insulating film 74A becomes small, and a variation in the dimension (film thickness) of the first protective insulating film 84 due to the variation of the etching amount becomes small, and it is possible to improve uniformity of the dimension (film thickness) of the first protective insulating film 84.

Moreover, in the step S42, by performing the anisotropic etching of the insulating film 74A in the Z(−) direction for the etching time which is longer than the etching time correlating with FIG. 12C described above, and as illustrated in FIG. 12D, by removing the insulating film 74A of the portion covering the surface of the third insulating film 44, the first protective insulating film 84 which covers the side wall of the first metal film 72, and exposes at least the portion of the side wall of the second metal film 73 may be formed. That is, the first protective insulating film 84 of the shape which is almost the same as the first protective insulating film 74 of Embodiment 1 may be formed.

Figure 12D:
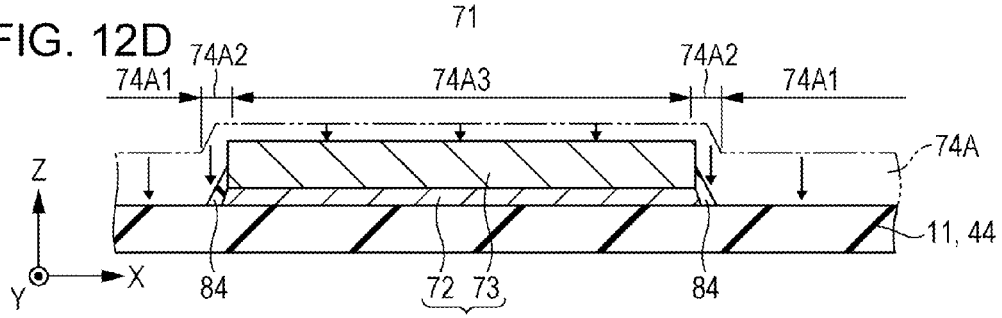

Therefore, the etching time for performing the anisotropic etching of the insulating film 74A in the Z(−) direction may be the etching time correlating with FIG. 12C described above, or may be the etching time correlating with FIG. 12D described above. Accordingly, in the step S42, the range of the proper etching time (allowed etching time) is widened in the performing of the anisotropic etching of the insulating film 74A in the Z(−) direction, in comparison with the step S4 of Embodiment 1, and it is possible to increase a process margin of the performing.

Furthermore, the step S8 (etching of the dielectric film 75) is treated, after passing through the step S5 (depositing of the insulating film), the step S6 (etching of the insulating film) and the step S7 (depositing of the dielectric film 75).

Figure 12E:
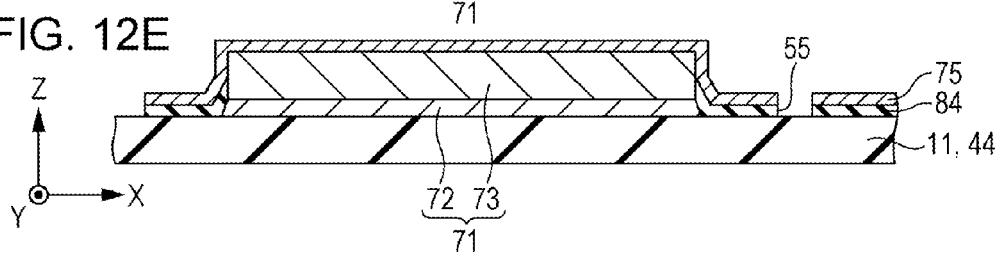

As illustrated in FIG. 12E, in the step S8, for example, the fluorine-based gas is used as reactive gas, and by the dry etching method using the capacitance coupling type dry etching device, the dielectric film 75 is etched, and the contact hole 55 penetrating the dielectric film 75 is formed. Specifically, in the step S8, the contact hole 55 (see FIG. 10) which penetrates the dielectric film 75, the first protective insulating film 84, and the third insulating film 44, and reaches the drain electrode 38 is formed, by etching the dielectric film 75, the first protective insulating film 84, and the third insulating film 44.

Furthermore, the element substrate 10A illustrated in FIG. 10 is formed, through the step S9 (depositing of the conductive film 77A), the step S10 (etching of the conductive film 77A), the step S11 (etching of the dielectric film 75), the step of forming the fourth insulating film 45, the step of forming the pixel electrode 9, and the step of forming the alignment film 39.

Electronic Apparatus

Figure 13:
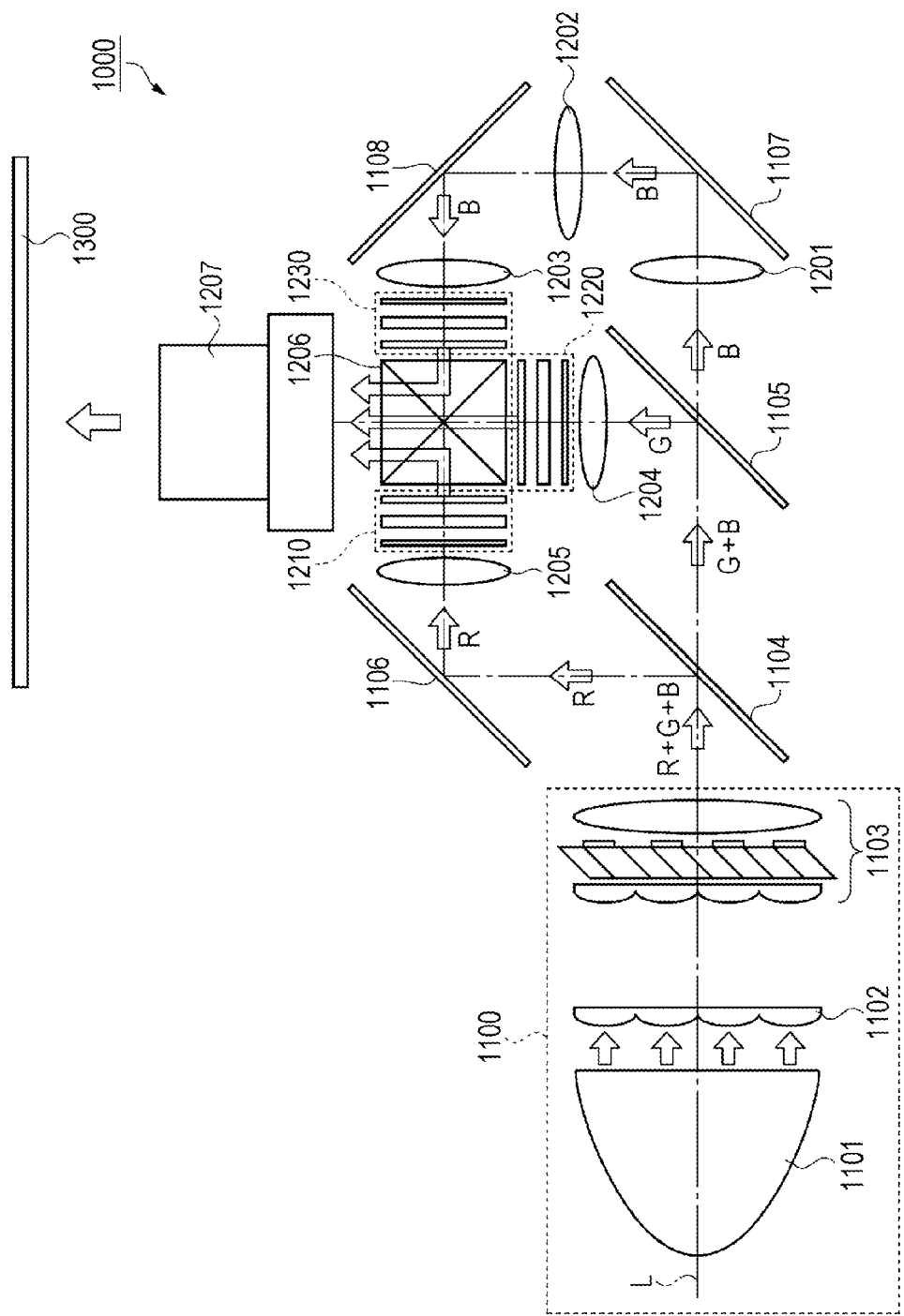
FIG. 13 a schematic diagram illustrating a configuration of a projection type display device as an electronic apparatus.

FIG. 13 a schematic diagram illustrating a configuration of a projection type display device (liquid crystal projector) as an electronic apparatus. Next, an electronic apparatus according to the embodiment, will be described with reference to FIG. 13.

As illustrated in FIG. 13, a projection type display device 1000 as an electronic apparatus, includes a polarization lighting device 1100 which is positioned along a system optical axis L, two dichroic mirrors 1104 and 1105 as a light separation element, three reflecting mirrors 1106, 1107 and 1108, five relay lenses 1201, 1202, 1203, 1204 and 1205, three transmission type liquid crystal light bulbs 1210, 1220 and 1230 as a light modulation element, a cross dichroic prism 1206 as a light synthesizing element, and a projection lens 1207.

The polarization lighting device 1100 is schematically configured by a lamp unit 1101 as a light source which is made up of a white light source such as an ultrahigh pressure mercury lamp or a halogen lamp, an integrator lens 1102, and a polarization conversion element 1103.

The dichroic mirror 1104 reflects red light (R), and transmits green light (G) and blue light (B), among the polarized light beams which are emitted from the polarization lighting device 1100. The other dichroic mirror 1105 reflects the green light (G) which is transmitted through the dichroic mirror 1104, and transmits the blue light (B).

The red light (R) which is reflected by the dichroic mirror 1104, is incident to the liquid crystal light bulb 1210 through the relay lens 1205 after being reflected by the reflecting mirror 1106.

The green light (G) which is reflected by the dichroic mirror 1105, is incident to the liquid crystal light bulb 1220 through the relay lens 1204.

The blue light (B) which is transmitted through the dichroic mirror 1105, is incident to the liquid crystal light bulb 1230 through an optical guiding system that is made up of three relay lenses 1201, 1202 and 1203, and two reflecting mirrors 1107 and 1108.

The liquid crystal light bulbs 1210, 1220 and 1230 are arranged so as to be positioned counter each other with respect to an incidence face per color light of the cross dichroic prism 1206. The color light which is incident to the liquid crystal light bulbs 1210, 1220 and 1230, is emitted toward the cross dichroic prism 1206 by being modulated on the basis of the image information (image signal). The prism is made by bonding four right-angled prisms, and a dielectric multilayer film of reflecting the red light and a dielectric multilayer film of reflecting the blue light are formed into a cross shape on an inner face thereof. Three color light beams are synthesized by the dielectric multilayer films, and the light beam representing the color image is synthesized. The synthesized light beam is projected onto a screen 1300 by the projection lens 1207 which is a projection optical system, and the image is displayed by being enlarged.

The liquid crystal device (liquid crystal device 100 of Embodiment 1, or liquid crystal device of Embodiment 2) according to the above-described embodiment, is applied to the liquid crystal light bulb 1210. The liquid crystal device according to the embodiment, is positioned by placing the gap between a pair of polarization elements of a cross nicol arrangement on the incidence side and the emission side of the color light. Other liquid crystal light bulbs 1220 and 1230 are similar thereto.

In the liquid crystal device according to the embodiment, the storage capacitor 70 is formed not only between the surface of the first capacitance electrode 71 and the dielectric film 75 and the second capacitance electrode 77, but also between the portion of the side wall of the first capacitance electrode 71 which is not covered by the first protective insulating films 74 and 84 and the dielectric film 75 and the second capacitance electrode 77, and the capacitance enlargement of the storage capacitor 70 is made, in comparison with the case where the storage capacitor 70 is formed only between the surface of the first capacitance electrode 71 and the dielectric film 75 and the second capacitance electrode 77. Accordingly, in the liquid crystal device according to the embodiment, the retention properties (potential retention properties of the pixel P) of the image signal which is written into the pixel electrode 9 is improved, and it is possible to provide the high-quality display.

Therefore, the projection type display device 1000 to which the liquid crystal device according to the embodiment is applied, can also provide the high-quality display.

Moreover, as an electronic apparatus, it is possible to apply the liquid crystal device according to the embodiment to various types of the electronic apparatuses such as a direct viewing type television, a mobile phone, a portable audio device, a personal computer, a video camera with monitor, a car navigation system, an electronic organizer, an electronic calculator, a workstation, a television phone, a POS terminal, and a digital still camera, in addition to the projection type display device 1000.

The entire disclosure of Japanese Patent Application No. 2014-227806, filed Nov. 10, 2014 is expressly incorporated by reference herein.

What is claimed is:

1. An electro-optical device comprising:
   a substrate;
   a lower capacitance electrode that is arranged above the substrate, and has a first metal film and a second metal film which is stacked onto the first metal film;
   a first protective insulating film that is arranged so as to cover a side wall of the first metal film, and expose at least a portion of a side wall of the second metal film;
   a dielectric film that is arranged throughout the side wall of the second metal film which is exposed from the first protective insulating film, and over the second metal film; and
   an upper capacitance electrode that is arranged throughout the dielectric film on the second metal film, and over the dielectric film which is arranged in the side wall of the second metal film exposed from the first protective insulating film.

2. The electro-optical device according to claim 1, wherein a direction along the substrate is a first direction, and an angle which is made by the first direction and the side wall of the second metal film, is greater than an angle which is made by the first direction and the side wall of the first metal film.

3. The electro-optical device according to claim 1, wherein a film thickness of the second metal film is the same as a film thickness of the first metal film, or is greater than the film thickness of the first metal film.

4. The electro-optical device according to claim 1, further comprising:
   a second protective insulating film that is positioned between the lower capacitance electrode and the dielectric film, and covers the lower capacitance electrode of a portion which does not overlap with the upper capacitance electrode in a planar view.

5. An electronic apparatus comprising:
   the electro-optical device according to claim 1.

6. An electronic apparatus comprising:
   the electro-optical device according to claim 2.

7. An electronic apparatus comprising:
   the electro-optical device according to claim 3.

8. An electronic apparatus comprising:
   the electro-optical device according to claim 4.

* * * * *